(12) United States Patent
Hachiya et al.

(10) Patent No.: US 12,078,903 B2
(45) Date of Patent: Sep. 3, 2024

(54) ACTIVE MATRIX SUBSTRATE AND LIQUID CRYSTAL DISPLAY DEVICE

(71) Applicant: Sharp Display Technology Corporation, Kameyama (JP)

(72) Inventors: Atsushi Hachiya, Kameyama (JP);
Hiroaki Furukawa, Kameyama (JP);
Yuhichi Saitoh, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 18/237,501

(22) Filed: Aug. 24, 2023

(65) Prior Publication Data
US 2024/0085752 A1 Mar. 14, 2024

Related U.S. Application Data

(60) Provisional application No. 63/404,978, filed on Sep. 9, 2022.

(51) Int. Cl.
*G02F 1/1368* (2006.01)
*G02F 1/1362* (2006.01)

(52) U.S. Cl.
CPC .... *G02F 1/13685* (2021.01); *G02F 1/136286* (2013.01)

(58) Field of Classification Search
CPC .................................................. G02F 1/1368
See application file for complete search history.

(56) References Cited

U.S. PATENT DOCUMENTS

| | | | |
|---|---|---|---|
| 5,672,888 A | 9/1997 | Nakamura | |
| 2010/0117079 A1* | 5/2010 | Miyairi | H01L 29/7869 257/E29.043 |
| 2011/0109351 A1 | 5/2011 | Yamazaki et al. | |
| 2012/0138922 A1 | 6/2012 | Yamazaki et al. | |
| 2012/0299074 A1 | 11/2012 | Hirose et al. | |
| 2013/0088668 A1* | 4/2013 | Seo | G02F 1/136286 349/126 |
| 2013/0320334 A1 | 12/2013 | Yamazaki et al. | |
| 2014/0286076 A1 | 9/2014 | Aoki et al. | |

FOREIGN PATENT DOCUMENTS

| | | | |
|---|---|---|---|
| JP | 09-162412 A | 6/1997 | |
| JP | 10-290012 A | 10/1998 | |
| JP | 2001-119030 A | 4/2001 | |
| JP | 2003-115595 A | 4/2003 | |
| JP | 2005-079283 A | 3/2005 | |
| JP | 2005079283 * | 3/2005 | ........... G02F 1/1368 |
| JP | 2007-165563 A | 6/2007 | |
| JP | 2012-134475 A | 7/2012 | |
| JP | 2013-008955 A | 1/2013 | |
| JP | 2014-007399 A | 1/2014 | |
| JP | 2014-209727 A | 11/2014 | |
| JP | 2016-184739 A | 10/2016 | |
| JP | 2019-161182 A | 9/2019 | |

* cited by examiner

*Primary Examiner* — Sang V Nguyen
(74) *Attorney, Agent, or Firm* — Keating & Bennett, LLP

(57) ABSTRACT

An active matrix substrate includes: a thin film transistor located in each pixel region; and a pixel electrode electrically coupled with the thin film transistor. The thin film transistor includes a lower gate electrode, a lower gate insulating layer, an oxide semiconductor layer, an upper gate insulating layer, and an upper gate electrode. The width of an upper gate line electrically coupled with the upper gate electrode is greater than the width of a lower gate line electrically coupled with the lower gate electrode.

11 Claims, 34 Drawing Sheets

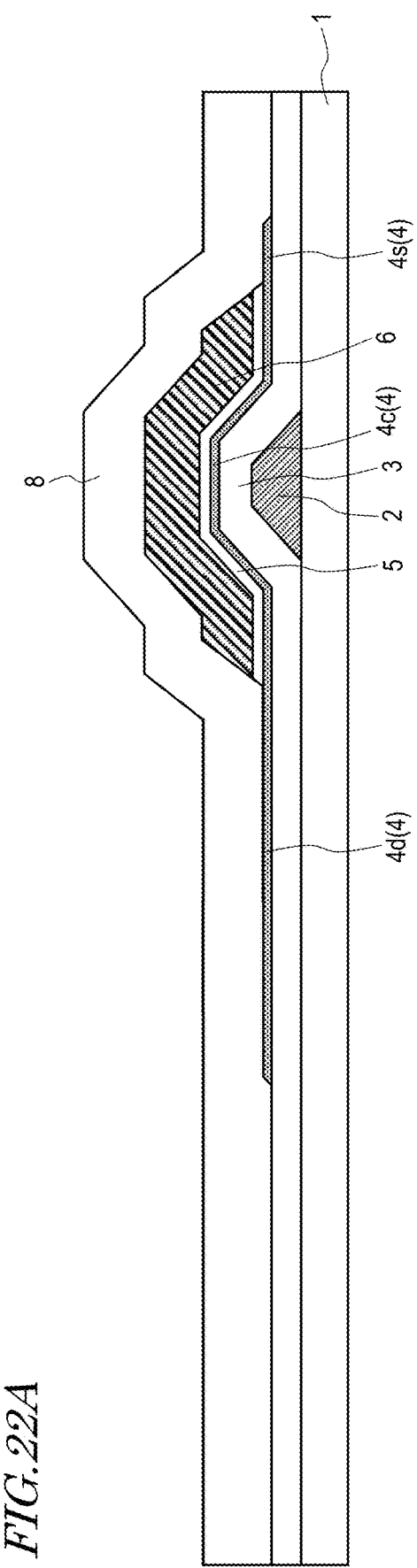
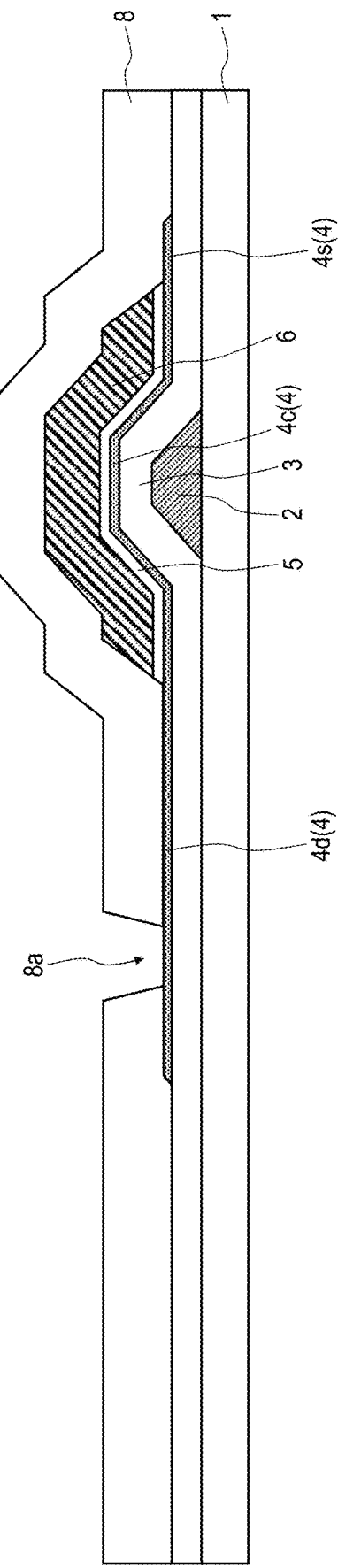
FIG.22A
FIG.22B

ACTIVE MATRIX SUBSTRATE AND LIQUID CRYSTAL DISPLAY DEVICE

BACKGROUND

1. Technical Field

The present invention relates to an active matrix substrate and particularly to an active matrix substrate including oxide semiconductor TFTs. The present invention also relates to a liquid crystal display device including such an active matrix substrate.

2. Description of the Related Art

In recent years, head-mounted displays (HMD) have increasingly higher display resolutions. Ultra-high resolution (e.g., 1000 ppi or higher) liquid crystal display devices for head-mounted displays are required to achieve a reduction in the size of a thin film transistor provided in each pixel (called "pixel TFT") for the purpose of improving the aperture ratio.

A possible solution to the above-described problem is to use an oxide semiconductor TFT as the pixel TFT. The oxide semiconductor TFT is a TFT including an oxide semiconductor layer as an active layer. For example, Patent Document No. 1 (Japanese Laid-Open Patent Publication No. 2012-134475) discloses an oxide semiconductor TFT in which an In—Ga—Zn—O based semiconductor is used as the material of the active layer. When a transparent oxide semiconductor is used as the material of the active layer of the pixel TFT while metal electrodes and the like are omitted, the pixel TFT can be partially transparent, and thus, the aperture ratio can be improved.

Note that the mobility of the oxide semiconductor is higher than that of amorphous silicon but is lower than that of polycrystalline silicon, such as LIPS (low-temperature polysilicon). Therefore, there is a limit to the reduction in the size of the oxide semiconductor TFT itself so long as charging of the pixels can be achieved at a sufficiently high rate.

A possible solution to the size reduction without reduction of the ON current is to employ a "double-gate structure" in the oxide semiconductor TFT. In an oxide semiconductor TFT having the double-gate structure, a pair of gate electrodes are provided so as to sandwich the oxide semiconductor layer. Specifically, a gate electrode is provided under the oxide semiconductor layer (hereinafter, referred to as "lower gate electrode") while another gate electrode is provided above the oxide semiconductor layer (hereinafter, referred to as "upper gate electrode"). An example of the double-gate structure oxide semiconductor TFT is disclosed in Patent Document No. 2 (Japanese Laid-Open Patent Publication No. 2016-184739).

SUMMARY

However, when the double-gate structure oxide semiconductor TFT is used, there is a concern that, as the display resolution further increases, the slope (level difference) which is attributed to two gate electrodes (i.e., two gate line layers) becomes larger as will be described later. If this slope (level difference) becomes larger, there is a probability that etching residues of the source metal (the metal material for formation of the source line) will occur on its side surface and cause leakage between lines.

The present invention was conceived in view of the above-described problems. An object of the present invention is to suppress occurrence of etching residues of the source metal in an active matrix substrate including double-gate structure oxide semiconductor TFTs.

This specification discloses an active matrix substrate and a liquid crystal display device as set forth in the following items.

[Item 1]
An active matrix substrate having a display region defined by a plurality of pixel regions arrayed in a matrix, the active matrix substrate comprising:
a substrate;
a thin film transistor supported by the substrate and located in a corresponding one of the plurality of pixel regions; and
a pixel electrode electrically coupled with the thin film transistor,
wherein the thin film transistor includes
a lower gate electrode provided on the substrate,
a lower gate insulating layer located so as to cover the lower gate electrode,
an oxide semiconductor layer provided on the lower gate insulating layer, the oxide semiconductor layer including a channel region opposing the lower gate electrode with the lower gate insulating layer interposed therebetween and a source contact region and a drain contact region located at opposite sides of the channel region,
an upper gate insulating layer provided on the channel region of the oxide semiconductor layer, and
an upper gate electrode provided on the upper gate insulating layer and opposing the channel region of the oxide semiconductor layer with the upper gate insulating layer interposed therebetween,
wherein the active matrix substrate includes
a lower gate metal layer that includes the lower gate electrode and a lower gate line electrically coupled with the lower gate electrode, and
an upper gate metal layer that includes the upper gate electrode and an upper gate line electrically coupled with the upper gate electrode, and
wherein a width of the upper gate line is greater than a width of the lower gate line.

[Item 2]
The active matrix substrate as set forth in Item 1, wherein the lower gate electrode and the upper gate electrode are electrically coupled with each other and supplied with an equal potential.

[Item 3]
The active matrix substrate as set forth in Item 1 or 2, wherein the width of the upper gate line is greater than the width of the lower gate line by 1.0 μm or more.

[Item 4]
The active matrix substrate as set forth in any of Items 1 to 3, further comprising a first flattening layer located so as to cover the thin film transistor, wherein the pixel electrode is provided on the first flattening layer.

[Item 5]
The active matrix substrate as set forth in Item 4, further comprising a connecting electrode electrically coupling the drain contact region of the oxide semiconductor layer with the pixel electrode, the connecting electrode being made of a transparent electrically-conductive material.

[Item 6]
The active matrix substrate as set forth in Item 5, wherein
the first flattening layer has an opening in which a part of the connecting electrode is located, and
the active matrix substrate further includes a second flattening layer provided so as to fill the opening of the first flattening layer, the second flattening layer being located so as to cover the part of the connecting electrode.

[Item 7]
The active matrix substrate as set forth in Item 6, wherein
the pixel electrode is in contact with a part of the connecting electrode which is not covered with the second flattening layer, and
the pixel electrode includes a portion located on the second flattening layer.

[Item 8]
The active matrix substrate as set forth in Item 4, further comprising a first connecting electrode for electrically coupling the drain contact region of the oxide semiconductor layer with the pixel electrode, the first connecting electrode being made of a transparent electrically-conductive material,
wherein the first flattening layer has a pixel contact hole formed such that the first connecting electrode is partially exposed, and
when viewed in a normal direction of the substrate, a bottom surface of the pixel contact hole at least partially overlaps the lower gate metal layer and the upper gate metal layer.

[Item 9]
The active matrix substrate as set forth in Item 8, wherein when viewed in the normal direction of the substrate, the bottom surface of the pixel contact hole at least partially overlaps the lower gate electrode and the upper gate electrode.

[Item 10]
The active matrix substrate as set forth in Item 8, wherein when viewed in the normal direction of the substrate, the entirety of the bottom surface of the pixel contact hole overlaps both the lower gate metal layer and the upper gate metal layer.

[Item 11]
The active matrix substrate as set forth in Item 10, wherein when viewed in the normal direction of the substrate, the entirety of the bottom surface of the pixel contact hole overlaps the lower gate electrode and the upper gate electrode.

[Item 12]
The active matrix substrate as set forth in any of Items 8 to 11, wherein a part of the first connecting electrode is in contact with the drain contact region of the oxide semiconductor layer.

[Item 13]
The active matrix substrate as set forth in any of Items 8 to 12, wherein a part of the pixel electrode is in contact with the first connecting electrode in the pixel contact hole.

[Item 14]
The active matrix substrate as set forth in any of Items 8 to 13, further comprising:
a second connecting electrode electrically coupling the first connecting electrode with the pixel electrode, the second connecting electrode being made of a transparent electrically-conductive material, the second connecting electrode being in contact with the first connecting electrode in the pixel contact hole; and
a second flattening layer provided so as to fill the pixel contact hole, the second flattening layer being located so as to partially cover the second connecting electrode,
wherein the pixel electrode is in contact with a part of the second connecting electrode which is not covered with the second flattening layer, and
the pixel electrode includes a portion located on the second flattening layer.

[Item 15]
The active matrix substrate as set forth in any of Items 1 to 14, wherein the oxide semiconductor layer includes an In—Ga—Zn—O based semiconductor.

[Item 16]
A liquid crystal display device comprising:
the active matrix substrate as set forth in any of Items 1 to 15;
a counter substrate provided so as to oppose the active matrix substrate;
a liquid crystal layer provided between the active matrix substrate and the counter substrate.

According to an embodiment of the present invention, in an active matrix substrate including double-gate structure oxide semiconductor TFTs, occurrence of etching residues of the source metal can be suppressed.

BRIEF DESCRIPTION OF THE DRAWINGS

FIG. 22A is a cross-sectional view illustrating a step of the manufacture process of the active matrix substrate 100.

FIG. 22B is a cross-sectional view illustrating a step of the manufacture process of the active matrix substrate 100.

DETAILED DESCRIPTION

Hereinafter, embodiments of the present invention are described with reference to the drawings, although the present invention is not limited to the following embodiments. In the following sections, the description is provided based on an example of an active matrix substrate for liquid crystal display devices.

Embodiment 1

Figure 1:
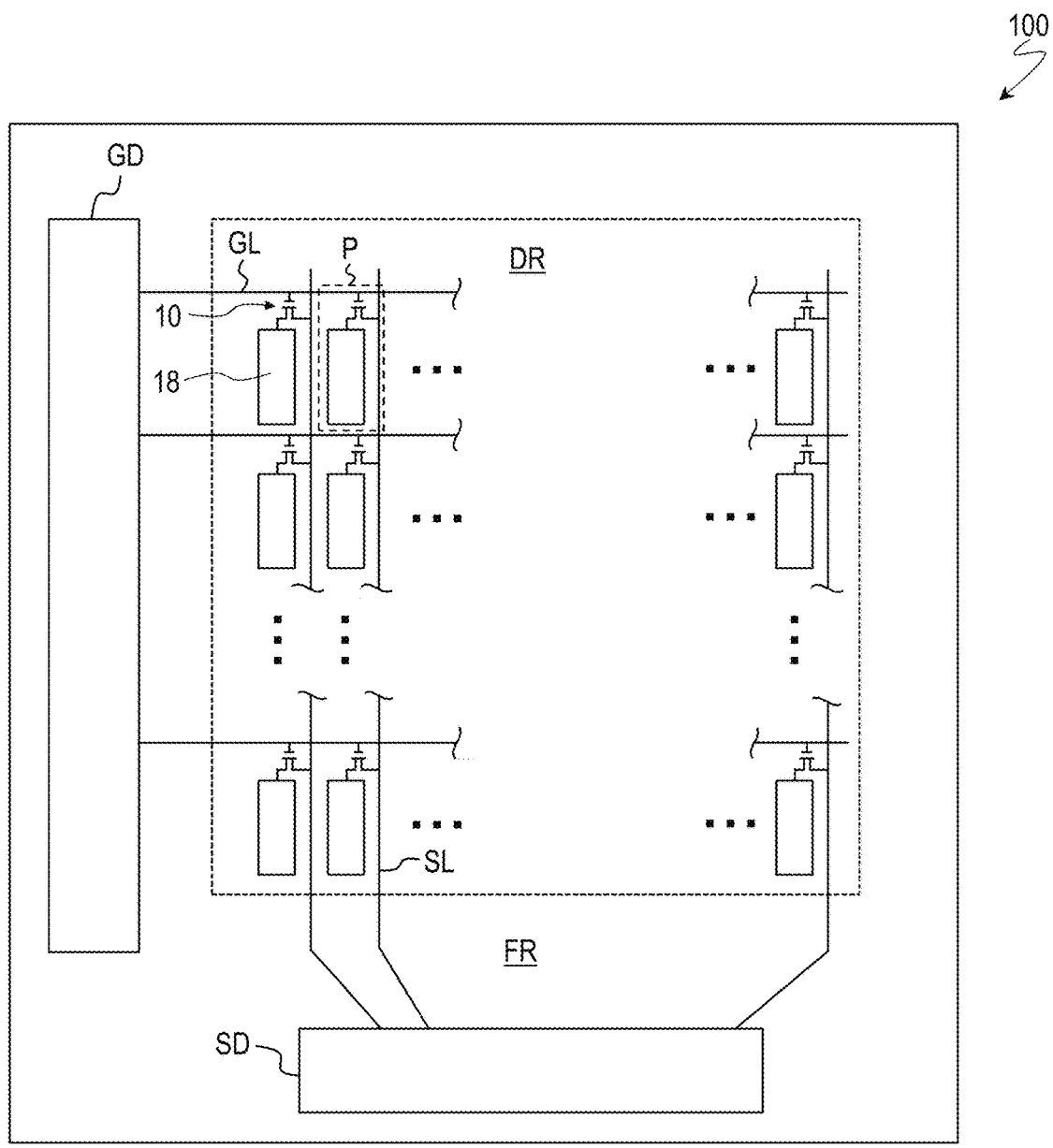
FIG. 1 is an overview showing an example of the planar configuration of an active matrix substrate 100 according to an embodiment of the present invention.

First, the general configuration of the active matrix substrate 100 of the present embodiment is described with reference to FIG. 1. FIG. 1 is an overview showing an example of the planar configuration of the active matrix substrate 100.

The active matrix substrate 100 has a display region DR and a non-display region FR (also referred to as "frame region") as shown in FIG. 1. The display region DR is defined by a plurality of pixel regions P. The plurality of pixel regions P are arrayed in a matrix including a plurality of columns and a plurality of rows. The pixel regions P correspond to the pixels of a liquid crystal display device and may be simply referred to as "pixels". The non-display region FR lies around the display region DR and does not contribute to displaying.

In the display region DR, a plurality of gate lines GL extending in the row direction and a plurality of source lines SL extending in the column direction are provided. Each of the pixel regions P is, for example, a region surrounded by a pair of gate lines GL which are neighboring each other and a pair of source lines SL which are neighboring each other.

In the non-display region FR, peripheral circuits are provided. Herein, in the non-display region FR, a gate driver GD for driving the gate lines GL is integrally (monolithically) formed, and a source driver SD for driving the source lines SL is mounted. In the non-display region FR, a Source Shared Driving (SSD) circuit for driving the source bus lines SL in a time division manner, or the like, may be provided. The SSD circuit, or the like, may be integrally formed as is the gate driver GD.

In each of the pixel regions P in the display region DR, a thin film transistor (TFT) 10 and a pixel electrode 18 electrically coupled with the TFT 10 are provided. The TFT 10 provided in each of the pixel regions P is sometimes referred to as "pixel TFT". The TFT 10 is supplied with a gate signal (scan signal) from a corresponding one of the gate lines GL and a source signal (display signal) from a corresponding one of the source lines SL. For the sake of simplicity, FIG. 1 shows a single gate line GL for each pixel row although, as will be described later, a lower gate line and an upper gate line are provided for each pixel row, and each of the TFTs 10 is supplied with gate signals from the lower gate line and the upper gate line.

Figure 2:
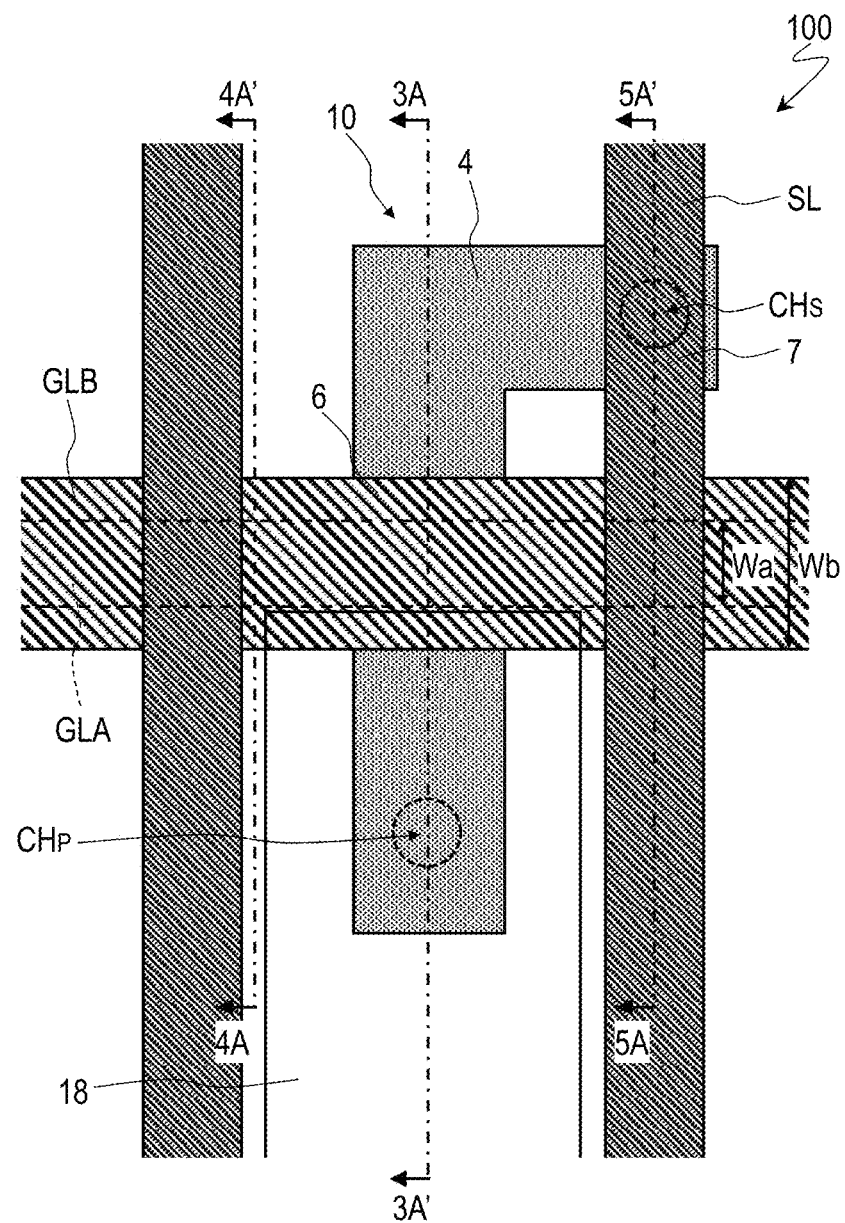
FIG. 2 is a plan view schematically showing the active matrix substrate 100.
Figure 3:
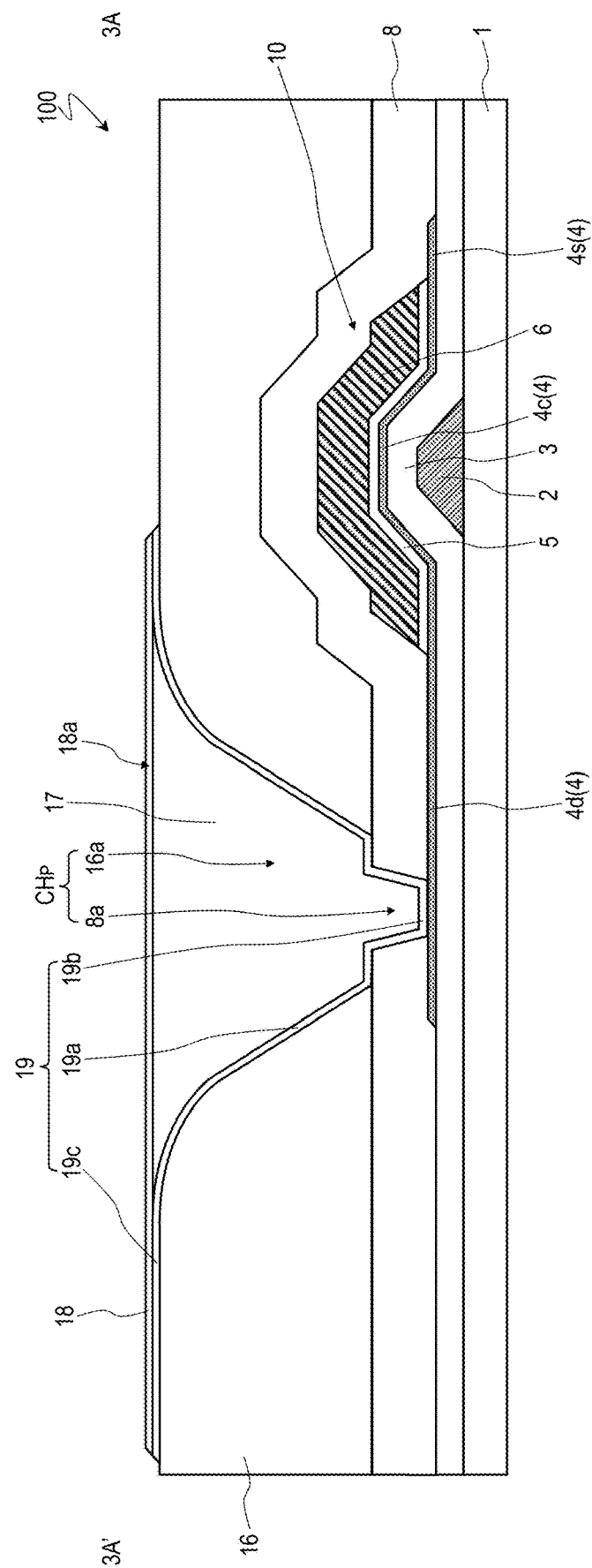
FIG. 3 is a cross-sectional view schematically showing the active matrix substrate 100, taken along line 3A-3A' of FIG. 2.
Figure 4:
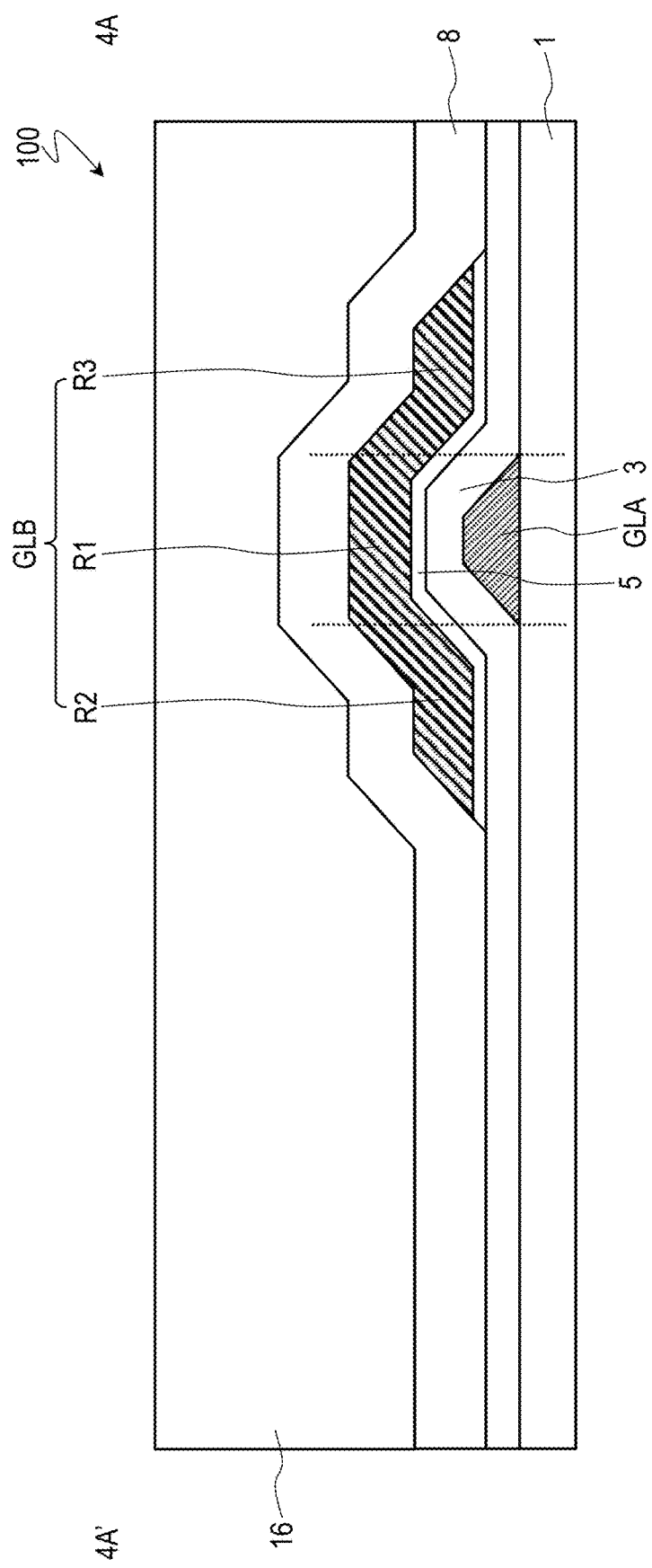
FIG. 4 is a cross-sectional view schematically showing the active matrix substrate 100, taken along line 4A-4A' of FIG. 2.
Figure 5:
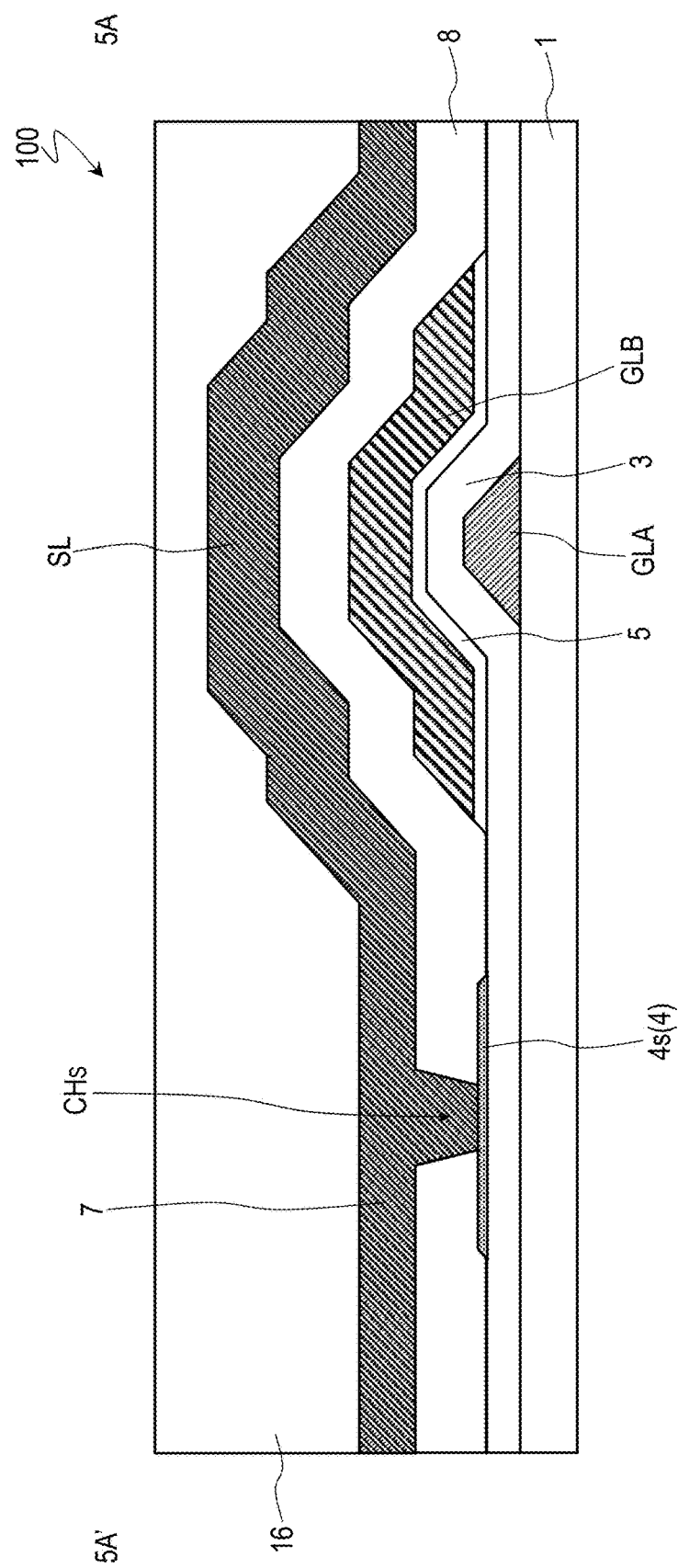
FIG. 5 is a cross-sectional view schematically showing the active matrix substrate 100, taken along line 5A-5A' of FIG. 2.

Next, a more specific configuration of the active matrix substrate 100 is described with reference to FIG. 2, FIG. 3, FIG. 4 and FIG. 5. FIG. 2 is a plan view schematically showing the active matrix substrate 100. FIG. 3, FIG. 4 and FIG. 5 are cross-sectional views schematically showing the active matrix substrate 100, taken along line 3A-3A', line 4A-4A' and line 5A-5A', respectively, of FIG. 2.

As shown in FIG. 2, FIG. 3, FIG. 4 and FIG. 5, the active matrix substrate 100 includes a substrate 1, a TFT 10 supported by the substrate 1, a first flattening layer 16 located so as to cover the TFT 10, and a pixel electrode 18 provided on the first flattening layer 16.

The substrate 1 is transparent and insulative. The substrate 1 is, for example, a glass substrate or a plastic substrate.

The TFT 10 is provided in each of the pixel regions P. The TFT 10 includes a lower gate electrode 2, a lower gate insulating layer 3, an oxide semiconductor layer 4, an upper gate insulating layer 5, an upper gate electrode 6 and a source electrode 7. That is, the TFT 10 has a double-gate structure.

The lower gate electrode 2 is provided on the substrate 1. The lower gate electrode 2 is electrically coupled with a corresponding lower gate line GLA. In the illustrated example, a part of the lower gate line GLA (specifically, a part of the lower gate line GLA which opposes the oxide semiconductor layer 4) functions as the lower gate electrode 2. In this specification, the lower gate electrode 2 and lines and/or electrodes formed in the same layer as the lower gate electrode 2 (by patterning an identical electrically-conductive film) are together referred to as "lower gate metal layer". Herein, the lower gate metal layer includes the lower gate electrode 2 and the lower gate line GLA. The lower gate insulating layer 3 covers the lower gate electrode 2.

The oxide semiconductor layer 4 is provided on the lower gate insulating layer 3. The oxide semiconductor layer 4 includes a channel region 4c opposing the lower gate electrode 2 with the lower gate insulating layer 3 interposed therebetween, and a source contact region 4s and a drain contact region 4d that are located at opposite sides of the channel region 4c.

The upper gate insulating layer 5 is provided on the channel region 4c of the oxide semiconductor layer 4. Typically, the thickness of the upper gate insulating layer 5 is smaller than that of the lower gate insulating layer 3. The ratio between the thickness of the upper gate insulating layer 5 and the thickness of the lower gate insulating layer 3 is, for example, about 1:2 to 1:3. The upper gate electrode 6 is provided on the upper gate insulating layer 5 and opposes the channel region 4c of the oxide semiconductor layer 4 with the upper gate insulating layer 5 interposed therebetween. The upper gate electrode 6 is electrically coupled with a corresponding upper gate line GLB. In the illustrated example, a part of the upper gate line GLB (specifically, a part of the upper gate line GLB which opposes the oxide semiconductor layer 4) functions as the upper gate electrode 6. In this specification, the upper gate electrode 6 and lines and/or electrodes formed in the same layer as the upper gate electrode 6 (by patterning an identical electrically-conductive film) are together referred to as "upper gate metal layer". Herein, the upper gate metal layer includes the upper gate electrode 6 and the upper gate line GLB. In the present embodiment, the lower gate electrode 2 and the upper gate electrode 6 are electrically coupled with each other and supplied with an equal potential.

An interlayer insulating layer 8 is provided so as to cover the upper gate electrode 6 and the oxide semiconductor layer 4. The source electrode 7 is provided on the interlayer insulating layer 8. The interlayer insulating layer 8 has a source contact hole $CH_S$ through which the source contact region 4s of the oxide semiconductor layer 4 is partially exposed. In the source contact hole $CH_S$, the source electrode 7 is in contact with the source contact region 4s and is electrically coupled with the source contact region 4s. The source electrode 7 is electrically coupled with a corresponding source line SL. In the illustrated example, a part of the source line SL (specifically, a part of the source line SL which opposes the oxide semiconductor layer 4) functions as the source electrode 7. In this specification, the source electrode 7 and lines and/or electrodes formed in the same layer as the source electrode 7 (by patterning an identical electrically-conductive film) are together referred to as "source metal layer". Herein, the source metal layer includes the source electrode 7 and the source line SL.

The first flattening layer 16 is provided so as to cover the TFT 10. The first flattening layer 16 is made of, for example, a photosensitive resin material. The pixel electrode 18 is provided on the first flattening layer 16. The pixel electrode 18 is electrically coupled with the TFT 10.

The active matrix substrate 100 further includes a connecting electrode 19 and a second flattening layer 17.

The connecting electrode 19 is made of a transparent electrically-conductive material. The connecting electrode 19 electrically couples the drain contact region 4d of the oxide semiconductor layer 4 with the pixel electrode 18. The first flattening layer 16 and the interlayer insulating layer 8 have a pixel contact hole $CH_P$ through which the drain contact region 4d of the oxide semiconductor layer 4 is partially exposed. The pixel contact hole $CH_P$ consists of an opening 16a formed in the first flattening layer 16 and an opening 8a formed in the interlayer insulating layer 8. The connecting electrode 19 includes a portion 19a located in the opening 16a of the first flattening layer 16 and a portion 19b located in the opening 8a of the interlayer insulating layer 8. The connecting electrode 19 is in contact with the drain contact region 4d in the pixel contact hole $CH_P$.

The second flattening layer 17 is provided so as to fill the opening 16a of the first flattening layer 16 and the opening 8a of the interlayer insulating layer 8. The second flattening layer 17 covers parts of the connecting electrode 19 (portions 19a and 19b).

The connecting electrode 19 further includes a portion 19c which is not covered with the second flattening layer 17, in addition to the above-described portions 19a and 19b. The pixel electrode 18 is in contact with this portion 19c. The pixel electrode 18 includes a portion 18a located on the second flattening layer 17.

The illustrated active matrix substrate 100 is to be used in FFS (Fringe Field Switching) mode liquid crystal display devices. Although not shown herein, the active matrix substrate 100 further includes a dielectric layer provided so as to cover the pixel electrode 18 and a common electrode provided on the dielectric layer and opposing the pixel electrode 18. The common electrode has at least one slit for each of the pixel regions P. Although not shown herein, an alignment film is provided so as to cover the common electrode.

In the active matrix substrate 100, as shown in FIG. 2, FIG. 3, FIG. 4 and FIG. 5, the width Wb of the upper gate line GLB (see FIG. 2) is greater than the width Wa of the lower gate line GLA (see FIG. 2). As such, as shown in FIG. 4, the upper gate line GLB includes a first region R1 that overlaps the lower gate line GLA when viewed in the normal direction of the substrate 1, and a second region R2 and a third region R3 that are located at opposite sides of the first region R1 and that do not overlap the lower gate line GLA when viewed in the normal direction of the substrate 1.

As described above, in the active matrix substrate 100 of the present embodiment, the width Wb of the upper gate line GLB is greater than the width Wa of the lower gate line GLA. Thus, occurrence of source metal etching residues can be suppressed. The reasons for this will be described in the following paragraphs.

Figure 6:
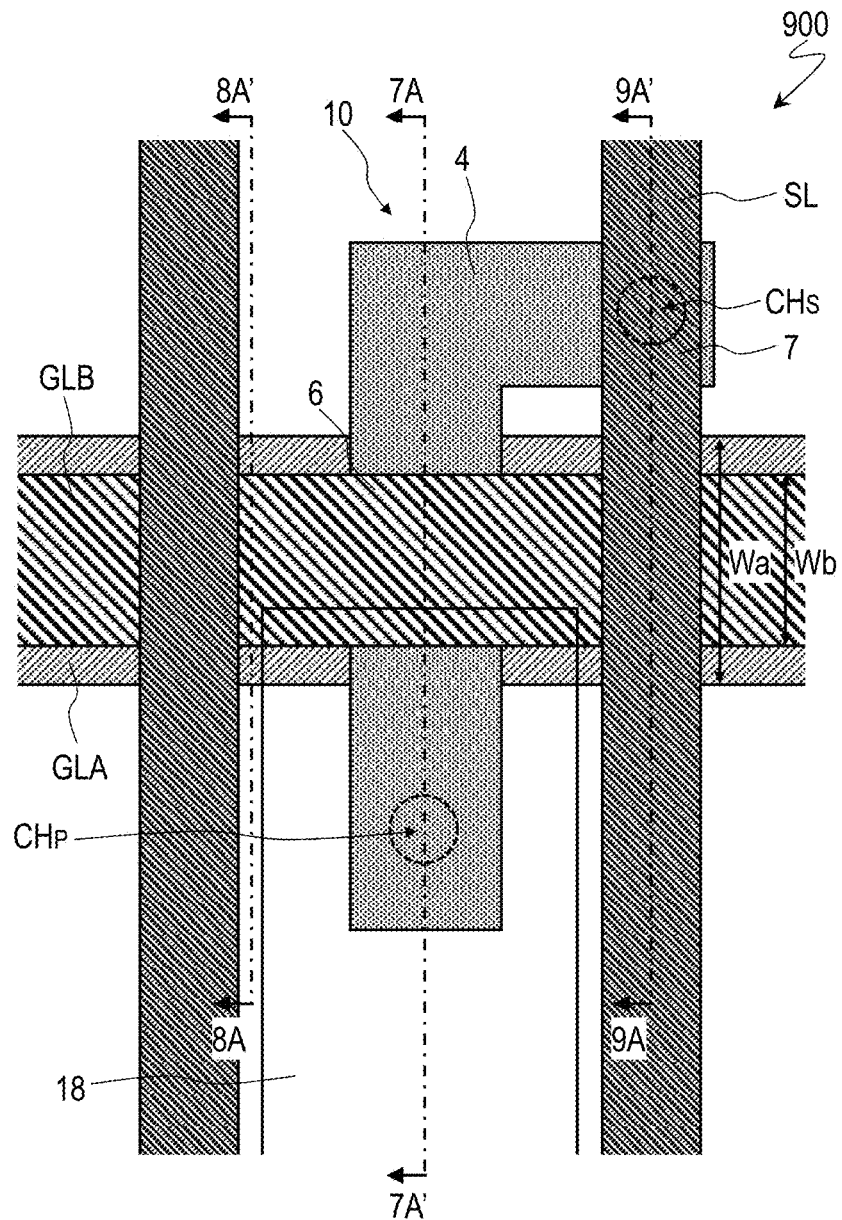
FIG. 6 is a plan view schematically showing an active matrix substrate 900 of Comparative Example.
Figure 7:
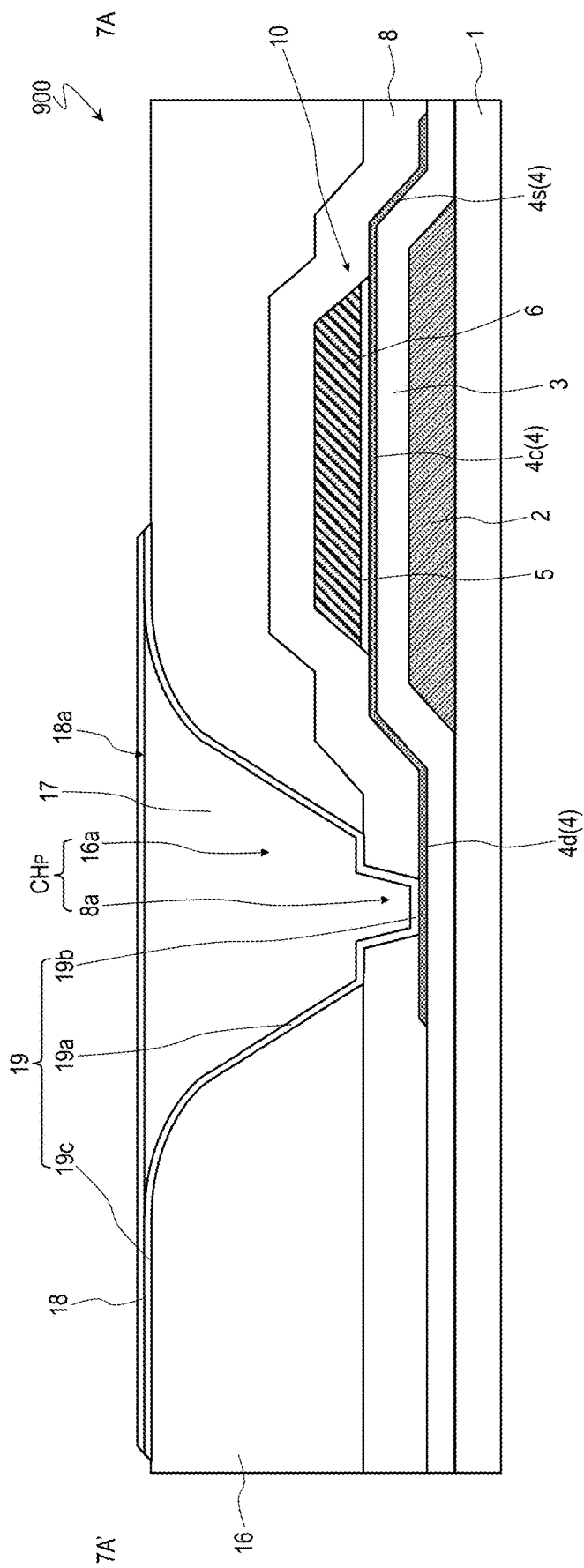
FIG. 7 is a cross-sectional view schematically showing the active matrix substrate 900, taken along line 7A-7A' of FIG. 6.
Figure 8:
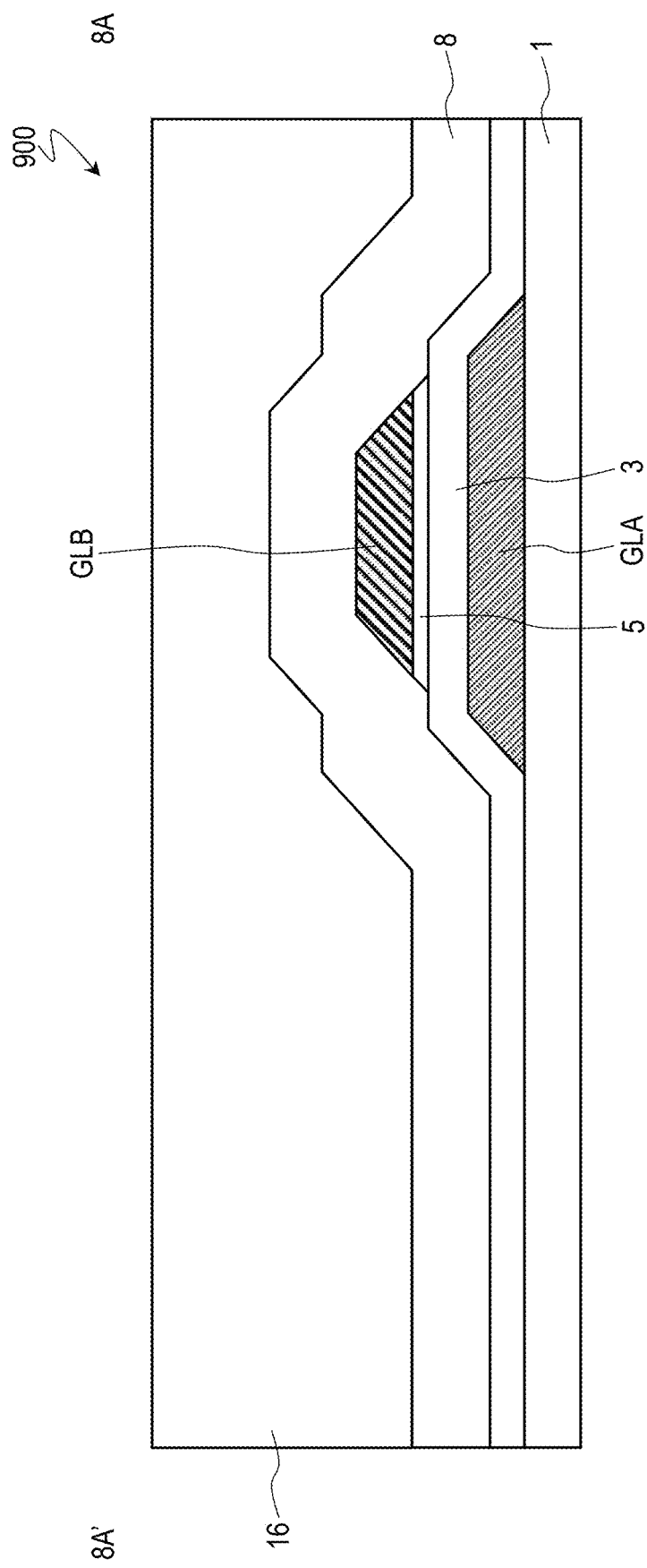
FIG. 8 is a cross-sectional view schematically showing the active matrix substrate 900, taken along line 8A-8A' of FIG. 6.
Figure 9:
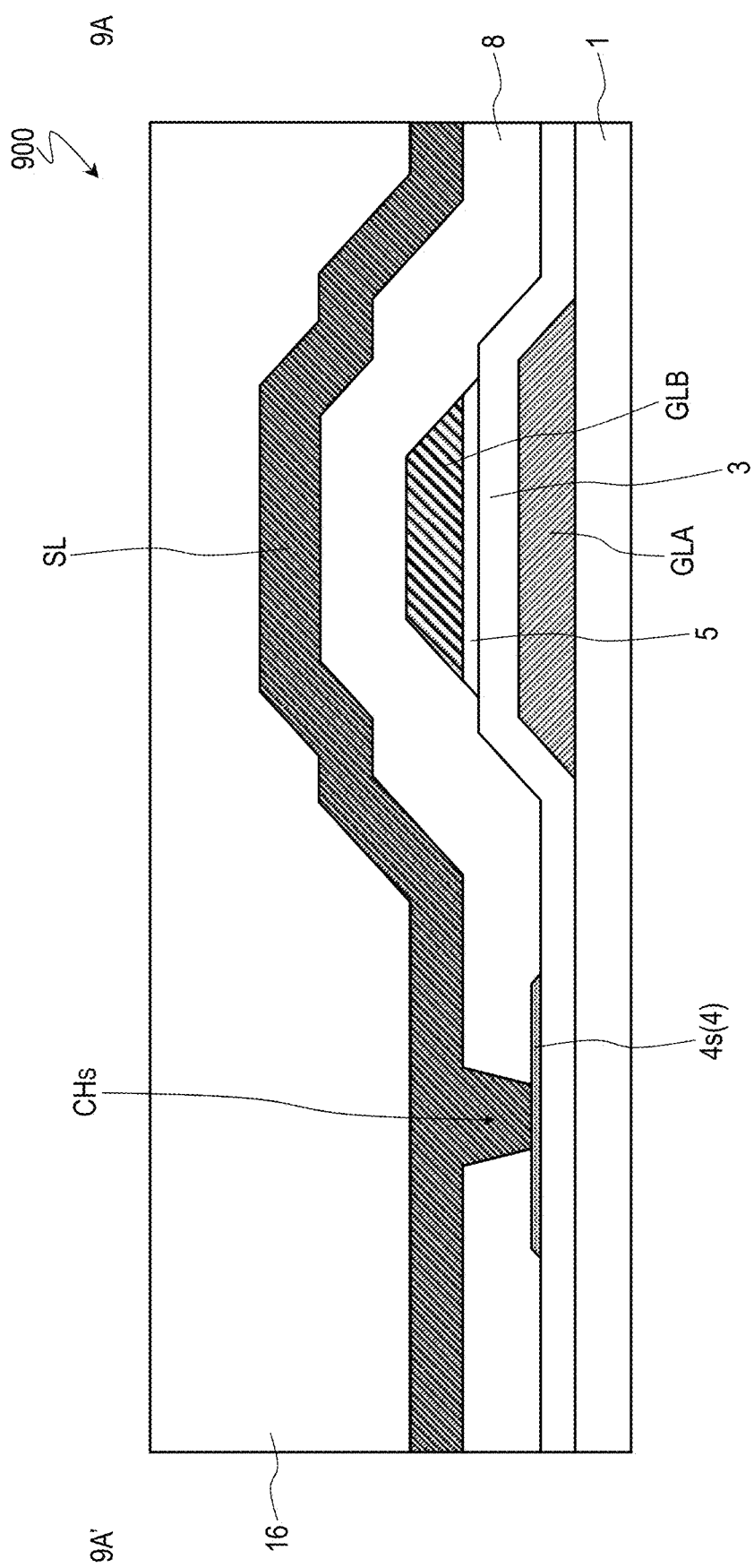
FIG. 9 is a cross-sectional view schematically showing the active matrix substrate 900, taken along line 9A-9A' of FIG. 6.

FIG. 6, FIG. 7, FIG. 8 and FIG. 9 show an active matrix substrate 900 of Comparative Example. FIG. 6 is a plan view schematically showing the active matrix substrate 900. FIG. 7, FIG. 8 and FIG. 9 are cross-sectional views schematically showing the active matrix substrate 900, taken along line 7A-7A', line 8A-8A' and line 9A-9A', respectively, of FIG. 6.

The active matrix substrate 900 of Comparative Example shown in FIG. 6, FIG. 7, FIG. 8 and FIG. 9 includes double-gate structure TFTs 10 as does the active matrix substrate 100. However, in the active matrix substrate 900, the width Wb of the upper gate line GLB is smaller than the width Wa of the lower gate line GLA. As such, the entirety of the upper gate line GLB overlaps the lower gate line GLA when viewed in the normal direction of the substrate 1.

Now, consider a case where, in the active matrix substrate 900 of Comparative Example, a sufficiently large size of the TFTs 10 can be secured, and the difference between the width Wa of the lower gate line GLA and the width Wb of the upper gate line GLB can be sufficiently large. In this case, the slope of the interlayer insulating layer 8 which is attributed to the lower gate line GLA and the upper gate line GLB (hereinafter, referred to as "gate slope") is in the form of a two-step stairway as shown in FIG. 7, FIG. 8 and FIG. 9. The heights of the two steps are respectively equal to the thickness of the lower gate line GLA and the thickness of the upper gate line GLB. Therefore, source metal etching residues are unlikely to occur.

Figure 10:
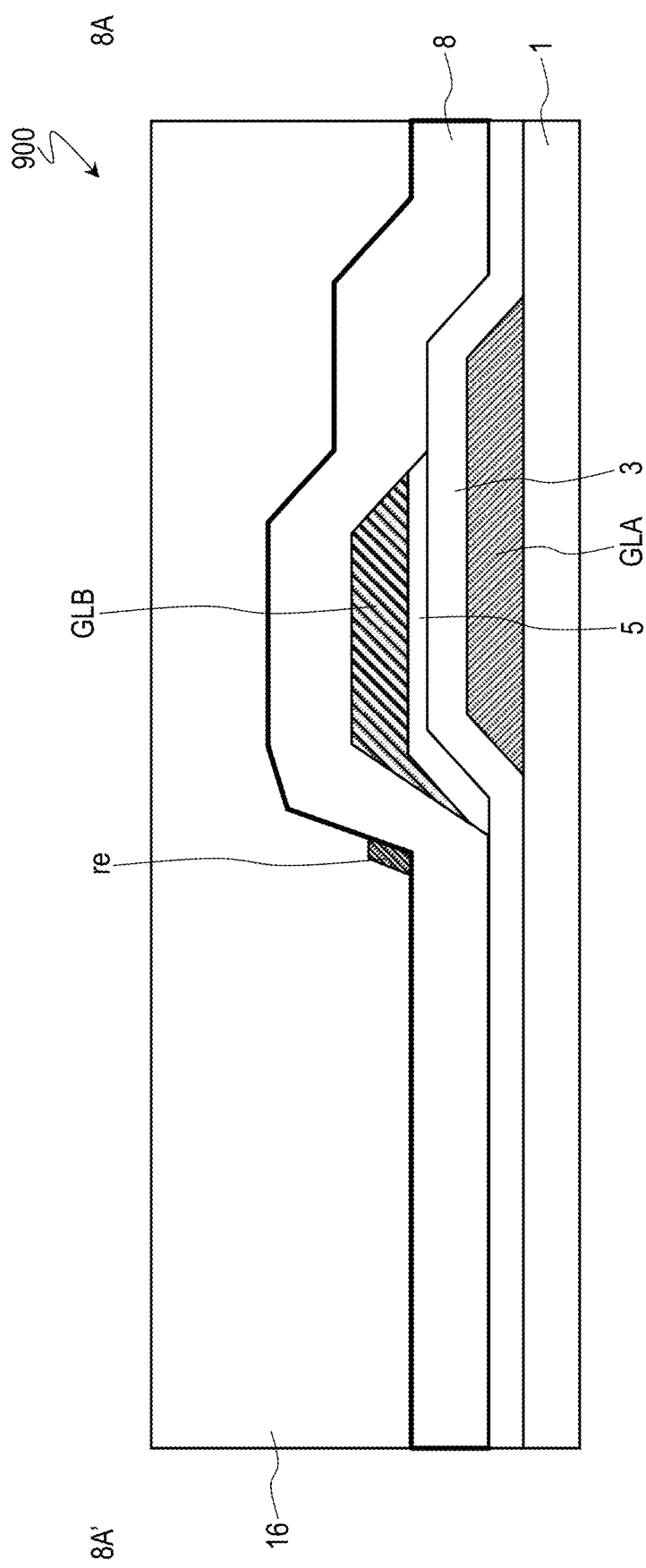
FIG. 10 is a cross-sectional view schematically showing the active matrix substrate 900, in which a side end of a lower gate line GLA and a side end of an upper gate line GLB are generally aligned.

On the other hand, consider a case where, as the display resolution of liquid crystal display devices increases, a sufficiently large size of the TFTs 10 cannot be secured, and the difference between the width Wa of the lower gate line GLA and the width Wb of the upper gate line GLB cannot be sufficiently large. In this case, due to misalignment or line width variation in the lower gate line GLA and the upper gate line GLB, a side end of the lower gate line GLA and a side end of the upper gate line GLB may be generally aligned, or a side end of the upper gate line GLB extends ahead of a side end of the lower gate line GLA and reaches the lower side of a slope of the lower gate insulating layer 3 (hereinafter, sometimes referred to as "lower gate slope"), as shown in FIG. 10 and FIG. 11 (which show cross sections corresponding to FIG. 8 and FIG. 9, respectively).

In this case, a gate slope of the interlayer insulating layer 8 (the slope on the left side in the example illustrated in FIG. 10 and FIG. 11) apparently consists of a single step, and the height of the single step is approximate to the sum of the thickness of the lower gate line GLA and the thickness of the upper gate line GLB. Also, at this gate slope, the interlayer insulating layer 8 has a steeply tapered shape.

Figure 11:
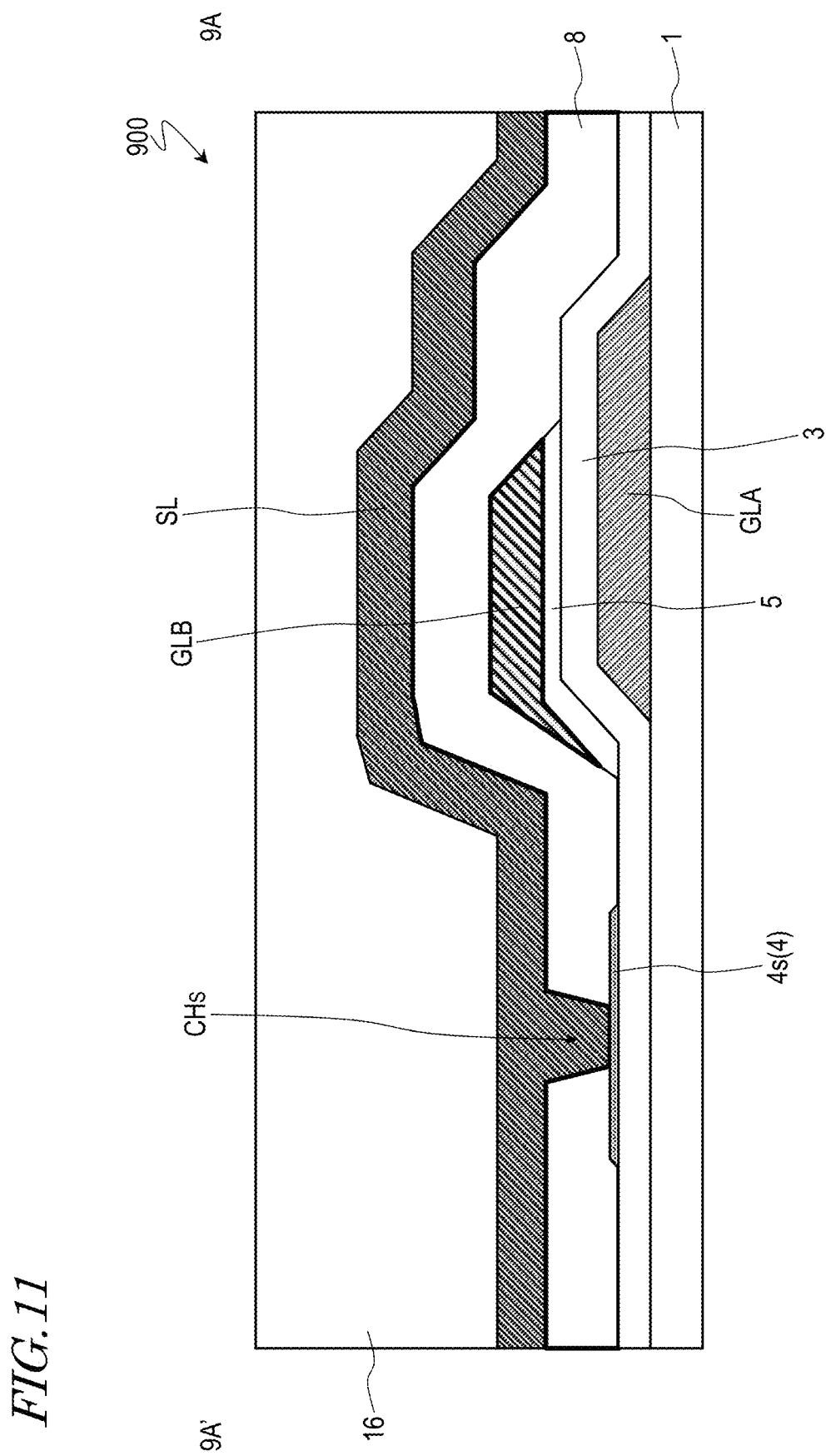
FIG. 11 is a cross-sectional view schematically showing the active matrix substrate 900, in which a side end of a lower gate line GLA and a side end of an upper gate line GLB are generally aligned.

If a source metal film is formed on the interlayer insulating layer 8 that has such a gate slope, the resultant source metal film has a generally uniform thickness across a large part of the film, although the thickness of the source metal film at the gate slope is approximately equal to the sum of the designed thickness and the height of the gate slope (see FIG. 11).

Thus, in patterning the source metal film, it is necessary to vertically etch away a portion much greater than the designed thickness of the source metal film by dry etching (anisotropic etching with a higher etching rate in the vertical direction). Therefore, a source metal portion near the gate slope cannot be sufficiently removed so that an etching residue re can occur along the gate slope (see FIG. 10), and there is a probability that leakage will occur between lines.

As a matter of course, it is expected that even if a sufficiently large size of the TFTs 10 cannot be secured, somehow increasing the difference between the width Wa of the lower gate line GLA and the width Wb of the upper gate line GLB enables suppression of occurrence of the etching residue re. However, if the width Wb of the upper gate line GLB (i.e., the width of the upper gate electrode 6) is decreased, the transistor characteristics will be more likely to fall into depression. Therefore, there is a limit in decreasing the line width of the upper gate line GLB. If the width Wa of the lower gate line GLA is increased, the transmittance will decrease. If the transmittance is improved while depression of the transistor characteristics is suppressed, the difference between the width Wa of the lower gate line GLA and the width Wb of the upper gate line GLB will decrease, occurrence of leakage due to the source metal etching residue re, such as described above, becomes apparent.

A possible solution for suppressing occurrence of leakage due to the etching residue re is to add, after patterning the source metal film, the step of applying a resist again so as to cover the source lines SL and removing the etching residue re (rework step). However, addition of such a rework step increases the process load and the product cost.

Figure 12:
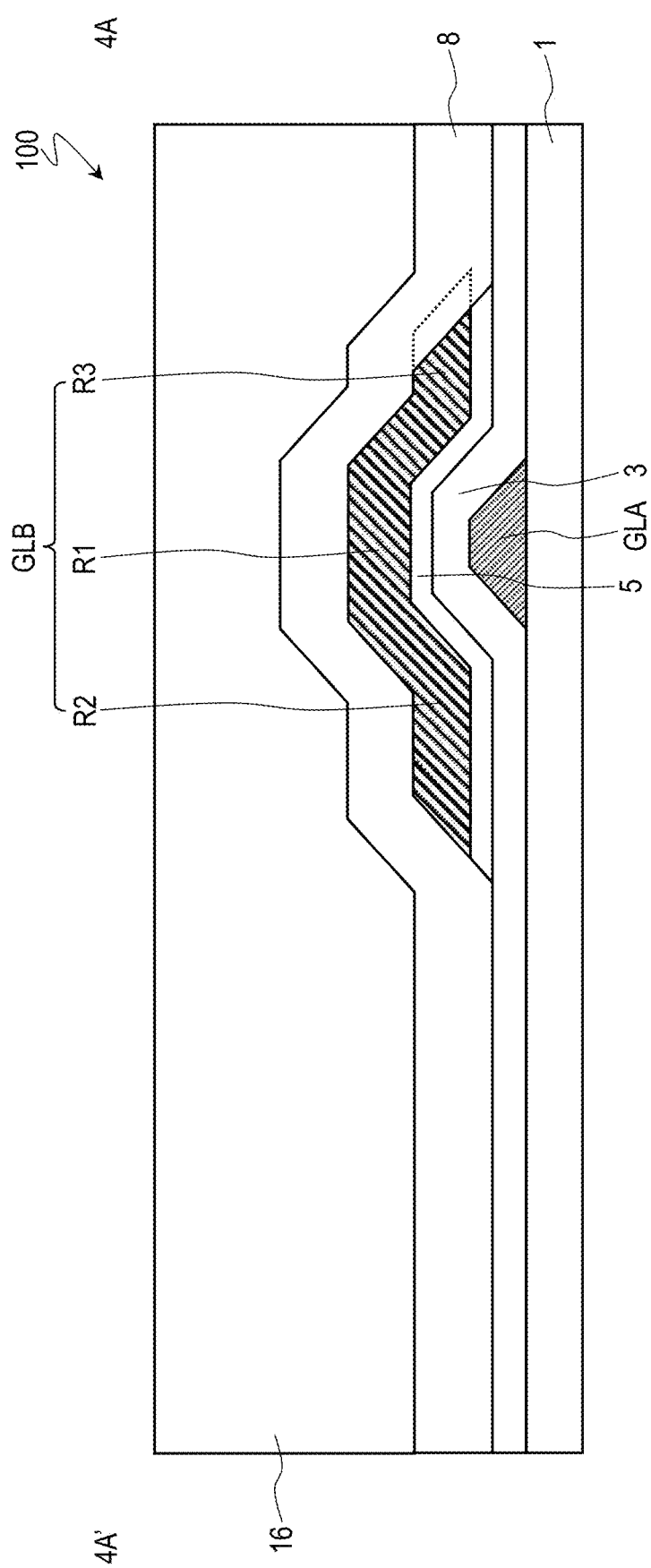
FIG. 12 is a cross-sectional view schematically showing the active matrix substrate 100, in which the upper gate line GLB is located with a deviation in the width direction from a designed position.

In contrast, in the active matrix substrate 100 of the present embodiment, the upper gate line GLB can be designed so as to extend to the lower side of the lower gate slope as shown in FIG. 4 and FIG. 5 because the width Wb of the upper gate line GLB is greater than the width Wa of the lower gate line GLA. Thus, even if the relative positional (physical) relationship between the lower gate line GLA and the upper gate line GLB is changed due to misalignment, the side end of the upper gate line GLB will not have an abnormal shape such as shown in FIG. 10. FIG. 12 shows a case where the upper gate line GLB is located with a deviation in the width direction (leftward in the drawing) from the designed position. As shown in FIG. 12, the position of the upper gate line GLB deviates from the designed position (shown by phantom line in FIG. 12), although the side end of the upper gate line GLB does not have an abnormal shape, and the gate slopes of the interlayer insulating layer 8 have a relatively gentle two-step shape. Thus, occurrence of the source metal etching residue re can be suppressed.

Figure 13:
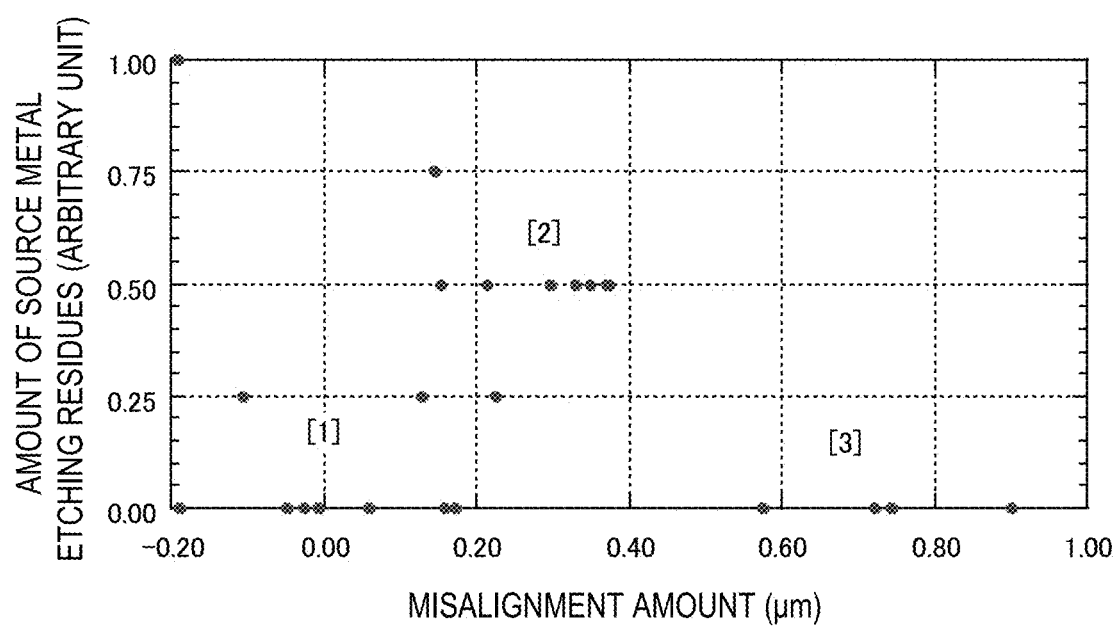
FIG. 13 is a graph showing the correlation between the misalignment amount and the amount of the source metal etching residue re where the design values of the width Wa of the lower gate line GLA and the width Wb of the upper gate line GLB are 4.8 μm and 3.4 μm, respectively.
Figure 14:
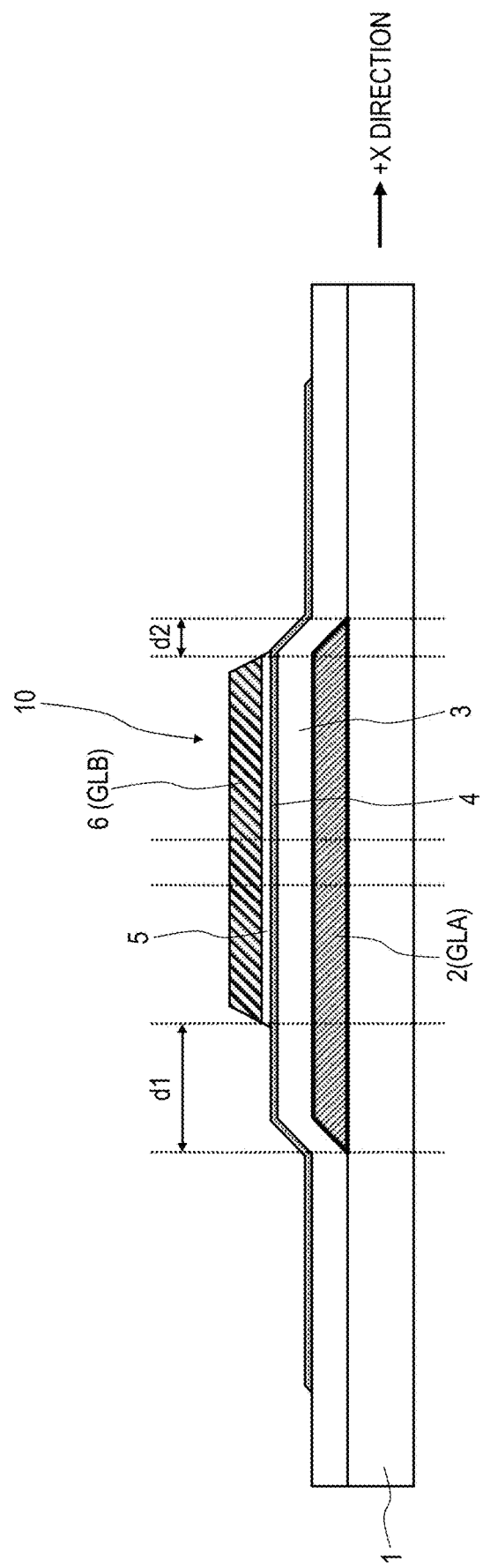
FIG. 14 is a diagram for description of the definition of the misalignment amount.

According to the studies by the present inventors, in the active matrix substrate 900 of Comparative Example, even if caused misalignment is smaller than the alignment margin determined by the design values, the amount of the etching residue re increases. In the active matrix substrate 900 of Comparative Example, for example, in the case where the design values of the width Wa of the lower gate line GLA and the width Wb of the upper gate line GLB are 4.8 μm and 3.4 μm, respectively, the margin which can prevent the upper gate line GLB from reaching the lower side of the lower gate slope is 0.7 μm in the design at one side. FIG. 13 shows the results of an examination as to the correlation between the misalignment amount and the amount of the source metal etching residue re in this case. FIG. 14 is a diagram for description of the definition of the misalignment amount. In FIG. 14, the direction from the left side to the right side is referred to as the positive direction (+X direction). Herein, the distance d1 from the left side end of the lower gate line GLA to the left side end of the upper gate line GLB is referred to as "left side misalignment amount", and the distance d2 from the right side end of the lower gate line GLA to the right side end of the upper gate line GLB is referred to as "right side misalignment amount". The misalignment amount X is determined by division by 2 of the left side misalignment amount d1 minus the right side misalignment amount d2 (i.e., X=(d1−d2)/2).

Figure 15:
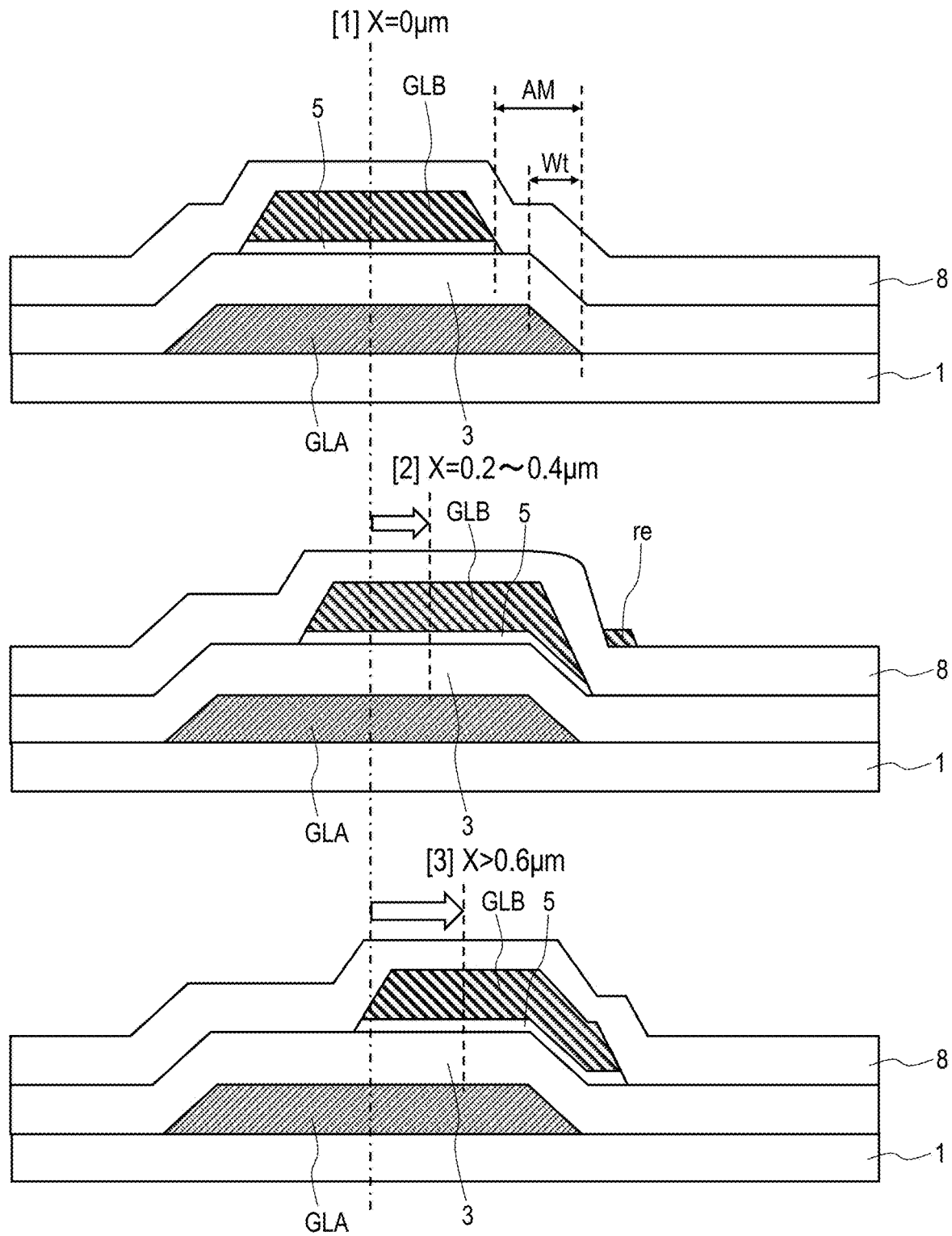
FIG. 15 is a diagram showing the positional (physical) relationship between the lower gate line GLA and the upper gate line GLB for the cases where the misalignment amount X is 0 μm (Case [1]), 0.2-0.4 μm (Case [2]), and more than 0.6 μm (Case [3]).

As seen from FIG. 13, in actuality, there is a trend that only a small deviation in alignment causes the amount of the etching residue re to increase. FIG. 15 is a diagram showing the positional (physical) relationship between the lower gate line GLA and the upper gate line GLB for the cases where the misalignment amount X is 0 μm (Case [1]), 0.2-0.4 μm (Case [2]), and more than 0.6 μm (Case [3]).

In the case illustrated in the upper part of FIG. 15 (Case [1]), the distance from the side end of the lower gate line GLA to the side end of the upper gate line GLB corresponds to the designed alignment margin AM (where the alignment margin is defined only by the final widths of the lower gate line GLA and the upper gate line GLB). Even if the alignment margin AM is 0.7 μm, the width Wt of the tapered side surface of the lower gate line GLA is about 0.4 μm. Therefore, if misalignment of about 0.2-0.4 μm occurs as in the case illustrated in in the middle part of FIG. 15 (Case [2]), the side end of the upper gate line GLB will reach the lower side of the lower gate slope of the lower gate insulating layer 3. This is because, in forming the upper gate line GLB through a photolithography process, a portion near the lower gate slope is unlikely to be exposed to light and unlikely to be etched away.

If misalignment of more than 0.6 μm occurs as in the case illustrated in in the lower part of FIG. 15 (Case [3]), the upper gate line GLB thoroughly extends to the lower side of the lower gate slope so that the source metal etching residue re is unlikely to occur.

Thus, it was found that, in the active matrix substrate 900 of Comparative Example, the actual alignment margin is smaller than the design value and is about a half of the design value.

From the viewpoint of more surely suppressing occurrence of the etching residue re, it is preferred that the width Wb of the upper gate line GLB is designed so as to be greater than the width Wa of the lower gate line GLA to some extent or more in consideration of how large expected misalignment and line width variation are. Specifically, the width Wb of the upper gate line GLB is preferably greater than the width Wa of the lower gate line GLA by 1.0 μm or more. The width of each of the second region R2 and the third region R3 of the upper gate line GLB is preferably 0.5 μm or more.

Figure 16:
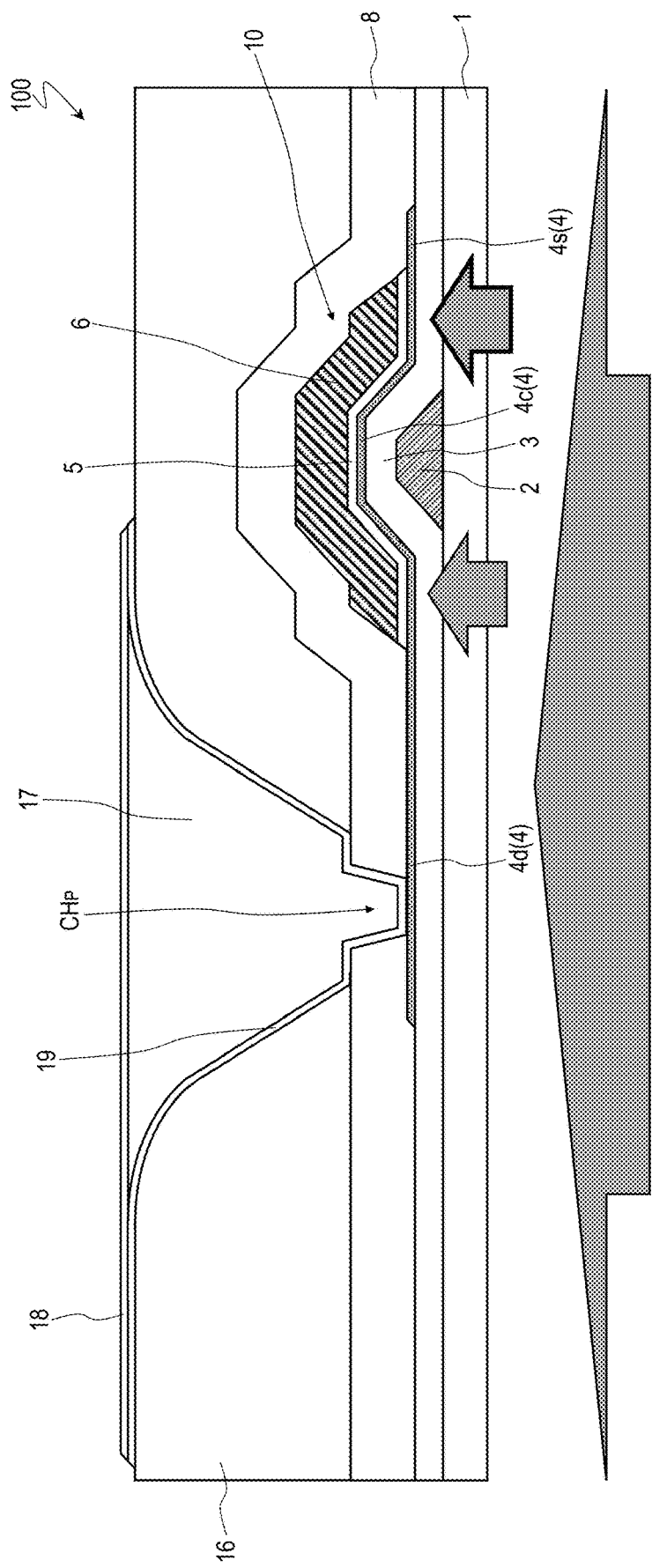
FIG. 16 is a diagram showing arrival of light from a backlight at a channel region 4c of an oxide semiconductor layer 4.

The lower gate electrode 2 and the upper gate electrode 6 are, preferably, electrically coupled with each other as illustrated and supplied with an equal potential. When the width Wb of the upper gate line GLB is greater than the width Wa of the lower gate line GLA, the channel region 4c of the oxide semiconductor layer 4 includes a region which does not overlap the lower gate electrode 2 (i.e., a region which is not shielded from light by the lower gate electrode 2). As shown in FIG. 16, when light from the backlight arrives at such a region, there is a probability that photoexcited electrons in the oxide semiconductor layer 4 will cause the transistor characteristics to shift, or such electrons will be accelerated by the electric field between the source and the drain and damage the oxide semiconductor, resulting in deterioration of the TFTs 10. Since the lower gate electrode 2 and the upper gate electrode 6 are electrically coupled with each other and have an equal potential, the potential on the lower gate electrode 2 side (back-channel side potential) is fixed, so that shift of the transistor characteristics due to incoming light to the channel region 4c and deterioration of the TFTs 10 can be suppressed.

We conducted a stress bias application test under temperature acceleration conditions on the active matrix substrate 100 of the present embodiment and the active matrix substrate 900 of Comparative Example to examine the amount of variations in the transistor characteristics. The results of the examination are now described. As the stress bias application test, specifically, a NBTIS (Negative Bias Temperature Illumination Stress) test was conducted, and the shift amount ΔVth sat of the saturation threshold voltage Vth sat before and after the test was measured. Herein, Vth sat is the gate voltage Vgs normalized with the channel length and channel width of the TFTs 10 and measured when the drain current Ids was 1 nA. The conditions of the NBTIS test are shown in TABLE 1.

TABLE 1

| Conditions of NBTIS test | |
| --- | --- |
| Stage Temperature | 60° C. |
| Stress Voltage | Vgs = −30 V |
| | Vds = 0 V |
| Stress Application Duration | 2000 sec |
| Vgs-Ids measurement | Vds = 10 V |
| | Vgs = −10 V to 30 V |
| Light Source Illuminance | 10000 lux |

Figure 17:
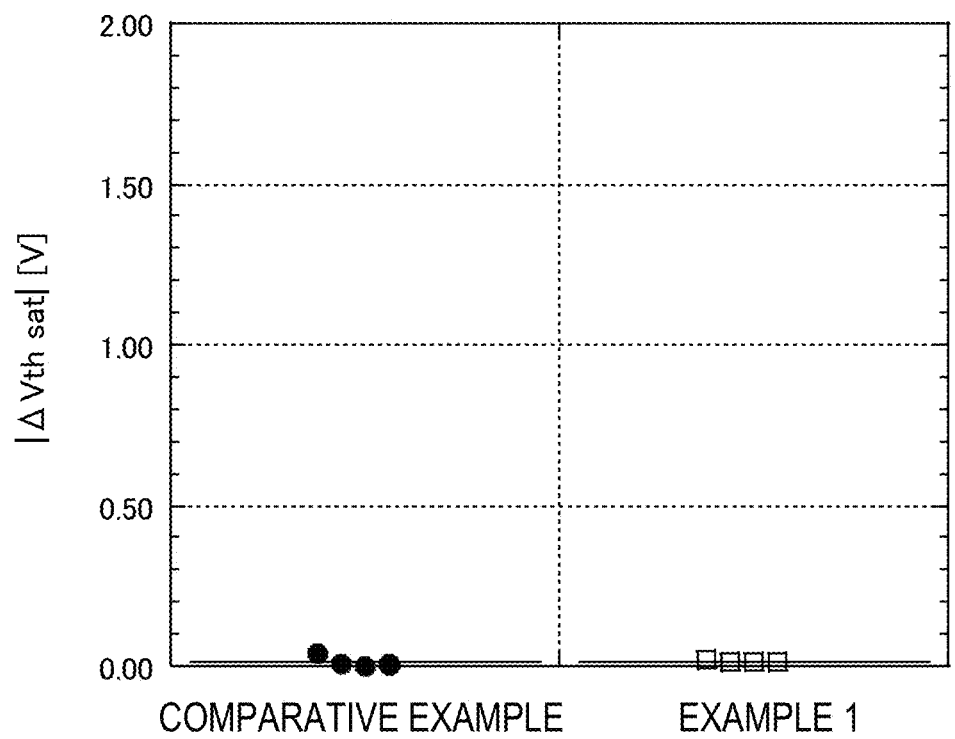
FIG. 17 is a graph showing the measurement results of ΔVth sat for the active matrix substrate 100 where a lower gate electrode 2 and an upper gate electrode 6 have an equal potential (Example 1) and the active matrix substrate 900 of Comparative Example.

FIG. 17 shows the measurement results of ΔVth sat for the active matrix substrate 100 where the lower gate electrode 2 and the upper gate electrode 6 have an equal potential (Example 1) and the active matrix substrate 900 of Comparative Example. It was confirmed from FIG. 17 that the characteristics variation amount in Example 1 is generally equal to that of Comparative Example.

Figure 18:
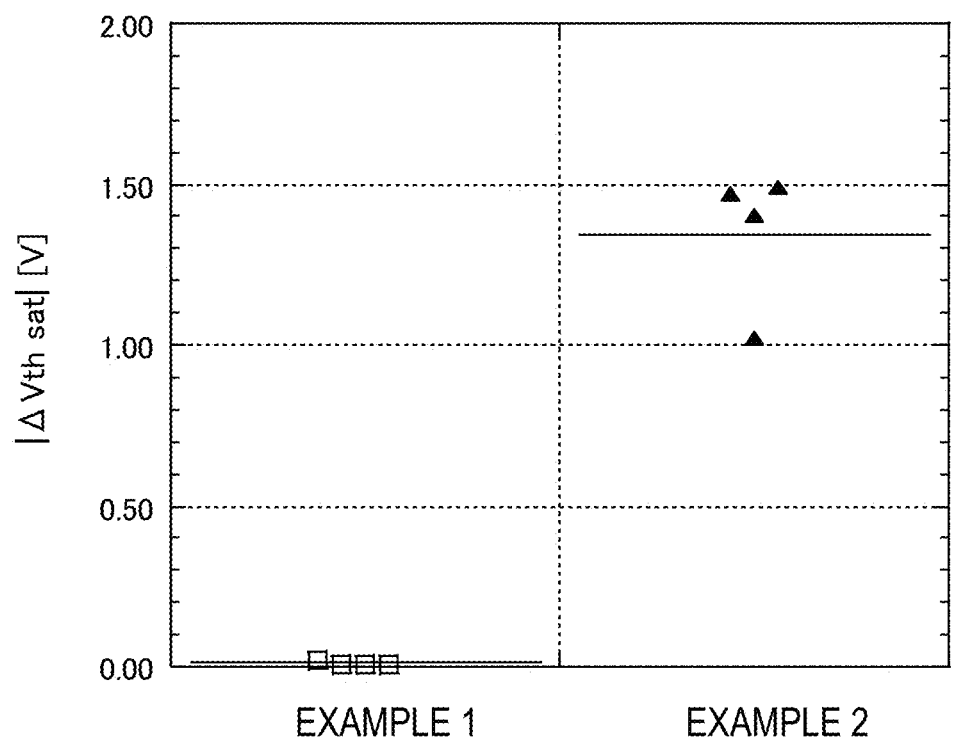
FIG. 18 is a graph showing the measurement results of ΔVth sat for the active matrix substrate 100 where the lower gate electrode 2 is in an electrically floating state (Example 2) and Example 1.

FIG. 18 shows the measurement results of ΔVth sat for the active matrix substrate 100 in an example where the lower gate electrode 2 is in an electrically floating state (Example 2) and Example 1 that has previously been described. It is understood from FIG. 18 that when the lower gate electrode 2 and the upper gate electrode 6 have an equal potential as in Example 1, the amount of variations in the transistor characteristics can be small.

When the thickness of the upper gate insulating layer 5 is smaller than the thickness of the lower gate insulating layer 3, the channel region 4c of the oxide semiconductor layer 4 is more susceptible to the effects of the potential on the upper gate electrode 6 side than the effects of the potential on the lower gate electrode 2 side. Thus, even if the width Wa of the lower gate line GLA is smaller than the width Wb of the upper gate line GLB, depression of the transistor characteristics due to the reduction of the channel length is unlikely to occur.

In the active matrix substrate 100 of the present embodiment, the drain contact region 4d of the oxide semiconductor layer 4 and the pixel electrode 18 are electrically coupled together by the connecting electrode 19 that is made of a transparent electrically-conductive material, and the opening 16a of the first flattening layer 16 is filled with the second flattening layer 17. The pixel electrode 18 includes the portion 18a located on the second flattening layer 17. Due to such a configuration, light leakage which is attributed to alignment disorder due to steps in the pixel contact hole CH$_P$ is suppressed and, therefore, a light shield layer for shielding the pixel contact hole CH$_P$ from light can be omitted. Thus, the aperture ratio can be improved.

Figure 19:
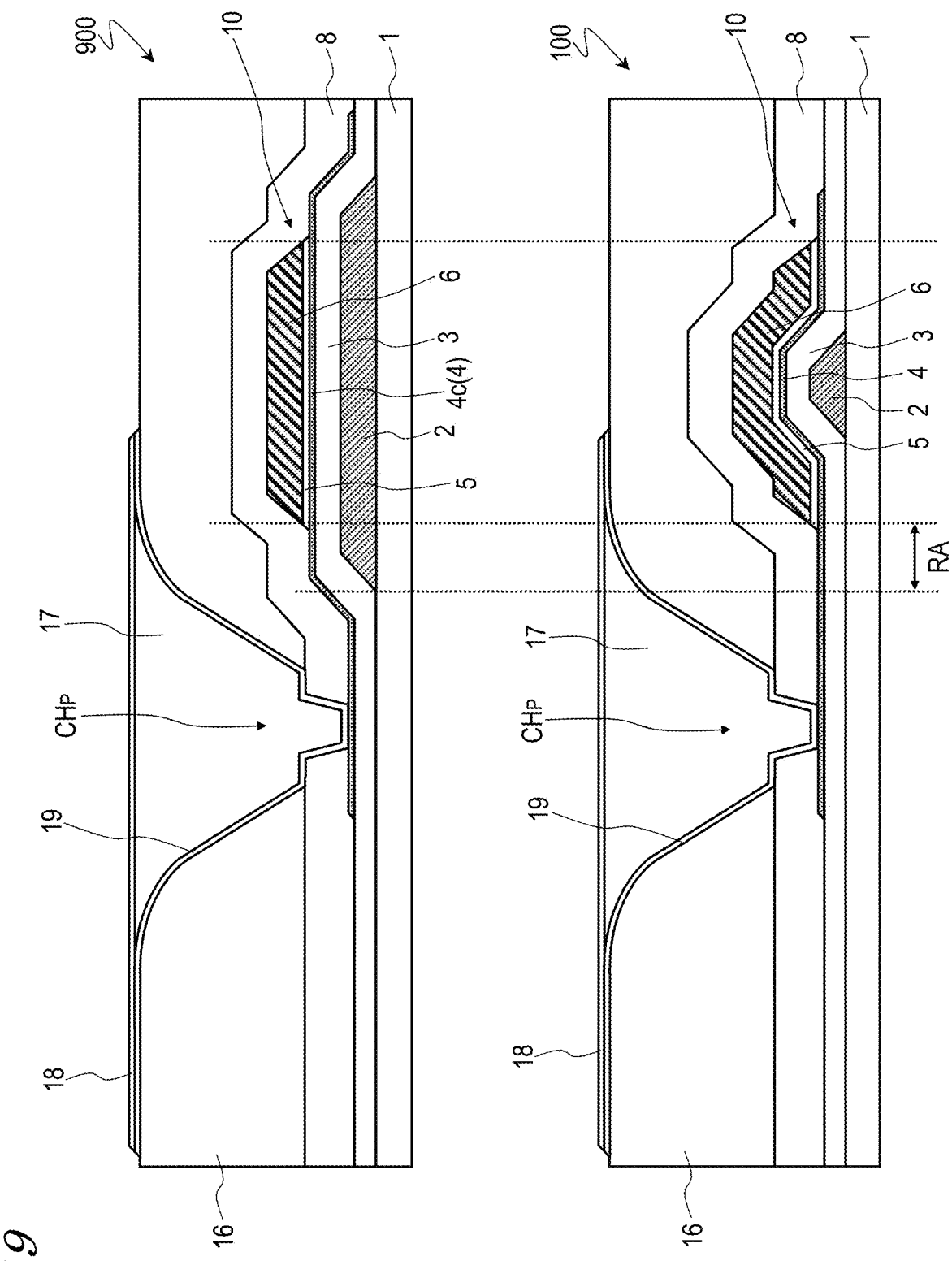
FIG. 19 shows the active matrix substrate 900 of Comparative Example (upper) and the active matrix substrate 100 (lower).

FIG. 19 shows the active matrix substrate 900 of Comparative Example (upper) and the active matrix substrate 100 (lower). In FIG. 19, in the active matrix substrate 900 of Comparative Example and the active matrix substrate 100, the width of the upper gate electrode 6 (the width Wb of the upper gate line GLB) is equal. As seen from FIG. 19, in the active matrix substrate 100, the width of the lower gate electrode 2 is smaller than the width of the upper gate electrode 6. Therefore, a region through which light from the backlight can travel through (i.e., a region which can contribute to displaying) is large as compared with the active matrix substrate 900 of Comparative Example (specifically, it is larger by the region RA of FIG. 19), so that the aperture ratio can be further improved.

An example of the manufacturing method of the active matrix substrate 100 of the present embodiment is described with reference to FIG. 20A, FIG. 20B, FIG. 20C, FIG. 21A, FIG. 21B, FIG. 22A, FIG. 22B, FIG. 23, FIG. 24, FIG. 25, and FIG. 26. FIG. 20A, FIG. 20B, FIG. 20C, FIG. 21A, FIG. 21B, FIG. 22A, FIG. 22B, FIG. 23, FIG. 24, FIG. 25, and FIG. 26 are cross-sectional views illustrating the steps of the manufacture process of the active matrix substrate 100.

Figure 20A:
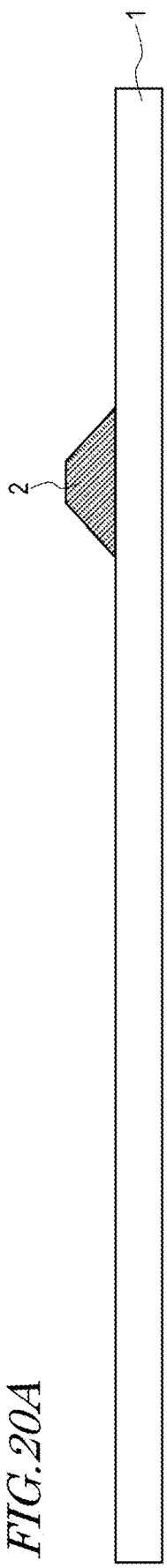
FIG. 20A is a cross-sectional view illustrating a step of the manufacture process of the active matrix substrate 100.

First, as shown in FIG. 20A, a lower gate electrode 2 and a lower gate line GLA (i.e., a lower gate metal layer) are formed on a substrate 1. For example, an electrically-conductive film is formed by sputtering and thereafter patterned through a photolithography process, whereby the lower gate electrode 2 and the lower gate line GLA can be formed.

As the substrate 1, for example, a glass substrate, a silicon substrate, a heat-resistant plastic substrate (resin substrate), or the like, can be used. As the electrically-conductive film for formation of the lower gate electrode 2 and the lower gate line GLA (lower gate metal film), a film which includes a metal such as aluminum (Al), tungsten (W), molybdenum (Mo), tantalum (Ta), chromium (Cr), titanium (Ti) or copper (Cu), an alloy thereof, or a nitride of the metal can be appropriately used. Alternatively, a multilayer film consisting of a plurality of such films may be used. Herein, as the lower gate metal film, a multilayer film prepared by forming a tantalum nitride (TaN) film and a W film in this order is used. The thickness of the lower gate metal film is, for example, equal to or greater than 100 nm and equal to or smaller than 500 nm.

Figure 20B:
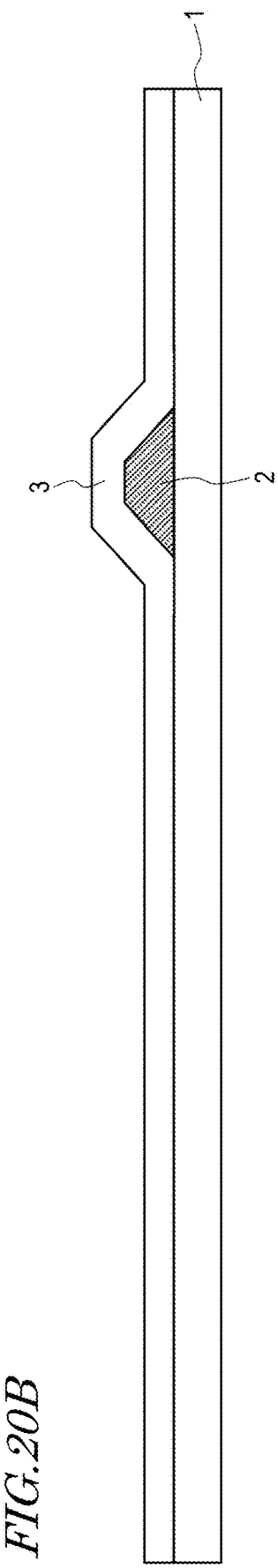
FIG. 20B is a cross-sectional view illustrating a step of the manufacture process of the active matrix substrate 100.

Then, as shown in FIG. 20B, a lower gate insulating layer 3 is formed so as to cover the lower gate electrode 2 and the lower gate line GLA. For example, the lower gate insulating layer 3 can be formed by CVD. As the lower gate insulating layer 3, a silicon oxide ($SiO_2$) layer, a silicon nitride (SiNx) layer, a silicon oxynitride (SiOxNy; x>y) layer, a silicon nitroxide (SiNxOy; x>y) layer, or the like, can be appropriately used. The lower gate insulating layer 3 may have a multilayer structure. For example, a SiNx layer may be formed as the lower layer on the substrate 1 side for preventing diffusion of impurities or the like from the substrate 1, and a $SiO_2$ layer for insulation may be formed as the upper layer on the SiNx layer. The thickness of the lower gate insulating layer 3 is, for example, equal to or greater than 150 nm and equal to or smaller than 400 nm.

Figure 20C:
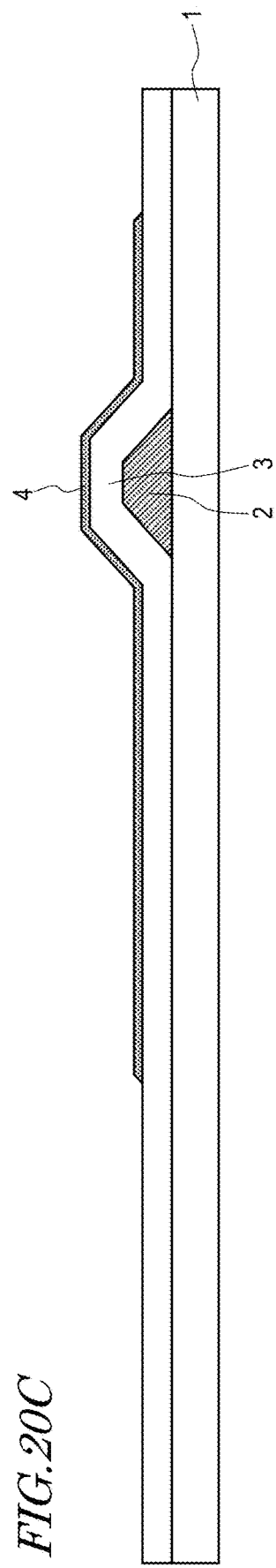
FIG. 20C is a cross-sectional view illustrating a step of the manufacture process of the active matrix substrate 100.

Subsequently, as shown in FIG. 20C, an oxide semiconductor layer 4 is formed on the lower gate insulating layer 3. For example, an oxide semiconductor film is deposited by sputtering and thereafter patterned through a photolithography process, whereby the oxide semiconductor layer 4 in the shape of islands can be formed. The oxide semiconductor layer 4 is formed so as to oppose the lower gate electrode 2 with the lower gate insulating layer 3 interposed therebetween. Herein, as the oxide semiconductor layer 4, an In—Ga—Zn—O based semiconductor layer with the composition ratio of In:Ga:Zn=1:1:1 is formed. The thickness of the oxide semiconductor layer 4 is, for example, equal to or greater than 10 nm and equal to or smaller than 60 nm.

Figure 21A:
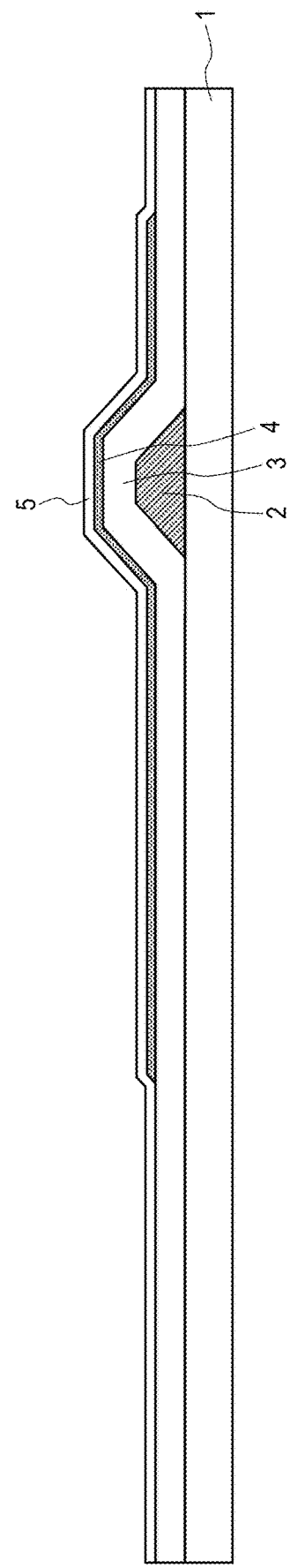
FIG. 21A is a cross-sectional view illustrating a step of the manufacture process of the active matrix substrate 100.

Then, as shown in FIG. 21A, an upper gate insulating layer 5 is deposited so as to cover the oxide semiconductor layer 4. Deposition of the upper gate insulating layer 5 is realized by, for example, CVD. Thereafter, an oxidation treatment (for example, baking or peroxidation treatment) of the oxide semiconductor layer 4 is performed. As the upper gate insulating layer 5, for example, an insulating layer similar to the lower gate insulating layer 3 (an insulating layer illustrated as the lower gate insulating layer 3) can be used. Herein, as the upper gate insulating layer 5, a silicon oxide ($SiO_2$) layer is formed. When an oxide layer such as silicon oxide layer is used as the upper gate insulating layer 5, oxygen deficiencies caused in the channel region 4c of the oxide semiconductor layer 4 can be reduced by the oxide layer and, therefore, reduction in the resistance of the channel region can be suppressed. The thickness of the upper gate insulating layer 5 is, for example, equal to or greater than 50 nm and equal to or smaller than 150 nm.

Figure 21B:
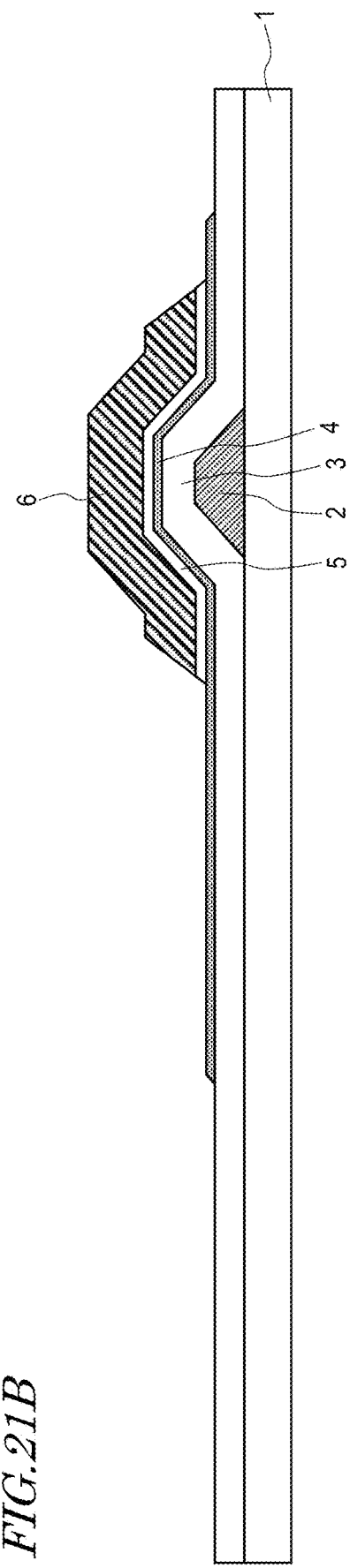
FIG. 21B is a cross-sectional view illustrating a step of the manufacture process of the active matrix substrate 100.

Subsequently, as shown in FIG. 21B, an upper gate electrode 6 and an upper gate line GLB (i.e., upper gate metal layer) are formed on the upper gate insulating layer 5. For example, an electrically-conductive film (upper gate metal film) is deposited by sputtering and, thereafter, the upper gate metal film is patterned through a photolithography process, whereby the upper gate electrode 6 and the upper gate line GLB can be formed. Thereafter, patterning of the upper gate insulating layer 5 is performed. Note that the upper gate insulating layer 5 can be patterned together with the upper gate metal film. As the upper gate metal film, for example, a film which includes a metal such as aluminum (Al), tungsten (W), molybdenum (Mo), tantalum (Ta), chromium (Cr), titanium (Ti) or copper (Cu), an alloy thereof, or a nitride of the metal can be used. Herein, as the upper gate metal film, a multilayer film prepared by forming a Ti film, an Al film and a Ti film in this order is used. The thickness of the upper gate metal film is, for example, equal to or greater than 100 nm and equal to or smaller than 400 nm.

Thereafter, a resistance reduction treatment may be performed on the oxide semiconductor layer 4 using the upper gate insulating layer 5 and the upper gate electrode 6 as a mask. The resistance reduction treatment may be, for example, a plasma treatment. By the resistance reduction treatment, regions of the oxide semiconductor layer 4 which do not overlap the upper gate insulating layer 5 or the upper gate electrode 6 (regions of the oxide semiconductor layer 4 which are to become the source contact region 4s and the drain contact region 4d) change into low-resistance regions whose specific resistance is lower than that of a region of the oxide semiconductor layer 4 which overlaps the upper gate insulating layer 5 and the upper gate electrode 6 (a region of the oxide semiconductor layer 4 which is to become the channel region 4c). The low-resistance regions may be electrical conductor regions (e.g., sheet resistance: 200Ω/☐ or lower). Note that the plasma treatment may be performed using the upper gate electrode 6 as a mask, without patterning the upper gate insulating layer 5. In such a case, the photolithography process of the upper gate insulating layer 5 can be omitted and, therefore, the manufacture process can be shortened. The method of the resistance reduction treatment is not limited to the plasma treatment. For example, the resistance reduction can be realized by bringing the exposed regions of the oxide semiconductor layer 4 into contact with a reductive insulating film that can deoxidize the oxide semiconductor. Alternatively, the resistance reduction can be realized by performing an ion implantation treatment, e.g., ion doping, on the oxide semiconductor layer 4. In this case, the ion implantation treatment can be performed through the upper gate insulating layer 5 and, therefore, the process can be shortened.

Then, as shown in FIG. 22A, an interlayer insulating layer 8 is formed so as to cover the oxide semiconductor layer 4 and the upper gate electrode 6. For example, the interlayer insulating layer 8 can be formed by CVD. As the interlayer insulating layer 8, an inorganic insulating layer, such as silicon oxide ($SiO_2$) layer, silicon nitride (SiNx) layer, silicon oxynitride (SiOxNy; x>y) layer, silicon nitroxide (SiNxOy; x>y) layer, or the like, can be used in the form of a single layer or a multilayer. The thickness of the interlayer insulating layer 8 is, for example, equal to or greater than 200 nm and equal to or smaller than 700 nm. Herein, a silicon oxide layer is used as the interlayer insulating layer 8.

Subsequently, as shown in FIG. 22B, an opening 8a is formed in the interlayer insulating layer 8 such that the drain contact region 4d of the oxide semiconductor layer 4 is partially exposed. Also, at this step, a source contact hole $CH_S$ is formed in the interlayer insulating layer 8 such that the source contact region 4s of the oxide semiconductor layer 4 is partially exposed. The opening 8a and the source contact hole $CH_S$ can be formed by, for example, patterning the interlayer insulating layer 8 through a photolithography process.

Then, a source electrode 7 and a source line SL (i.e., source metal layer) are formed on the interlayer insulating layer 8. For example, an electrically-conductive film is deposited by sputtering and thereafter patterned through a photolithography process, whereby the source electrode 7 and the source line SL can be formed. As the electrically-conductive film for formation of the source electrode 7 and the source line SL (source metal film), a film which includes a metal such as aluminum (Al), tungsten (W), molybdenum (Mo), tantalum (Ta), copper (Cu), chromium (Cr) or titanium (Ti), an alloy thereof, or a nitride of the metal can be appropriately used. Alternatively, a multilayer film consisting of a plurality of such films may be used. Herein, as the source metal film, a multilayer film prepared by forming a Ti film, an Al film and a Ti film in this order is used. The thickness of the source metal film is, for example, equal to or greater than 200 nm and equal to or smaller than 700 nm.

Figure 23:
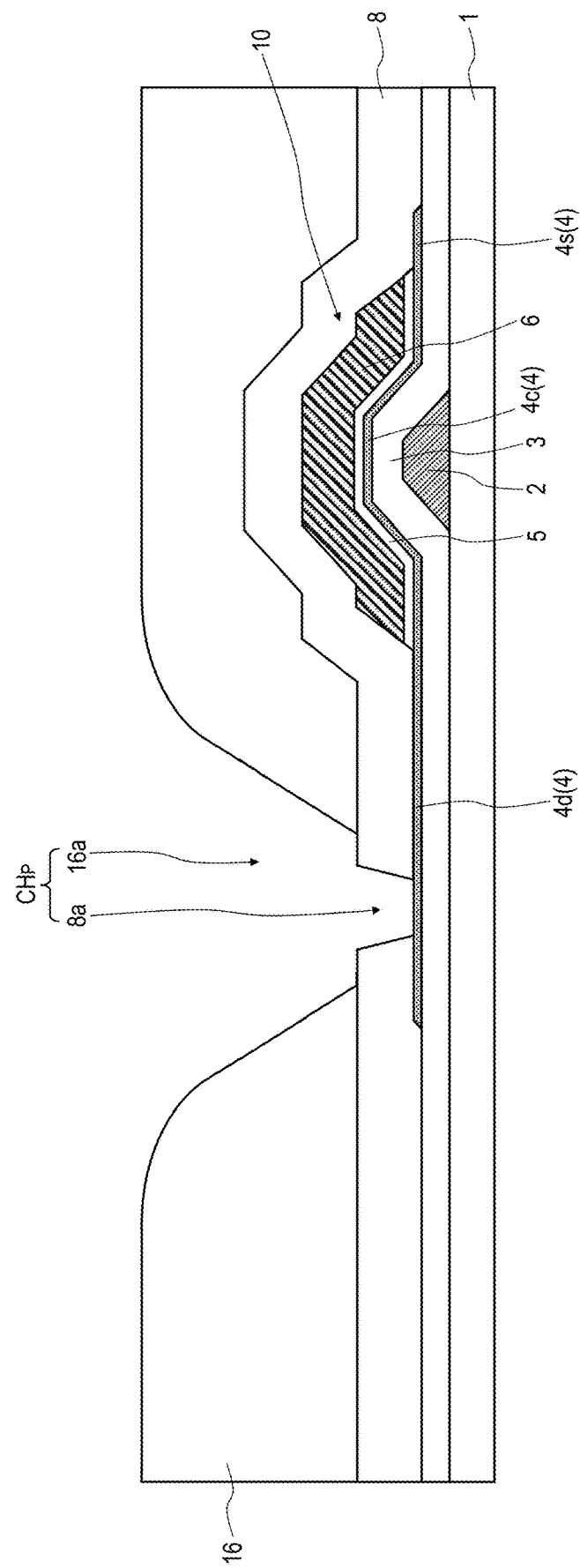
FIG. 23 is a cross-sectional view illustrating a step of the manufacture process of the active matrix substrate 100.

Subsequently, as shown in FIG. 23, a first flattening layer 16 is formed so as to cover the TFTs 10. For example, a photosensitive resin material is applied, and exposure and development processes are performed, whereby the first flattening layer 16 is formed, which has an opening 16a located so as to overlap the opening 8a of the interlayer insulating layer 8. As the photosensitive resin material, for example, a photosensitive acrylic resin can be used. The thickness of the first flattening layer 16 is, for example, about 2.0 μm to 3.0 μm.

Figure 24:
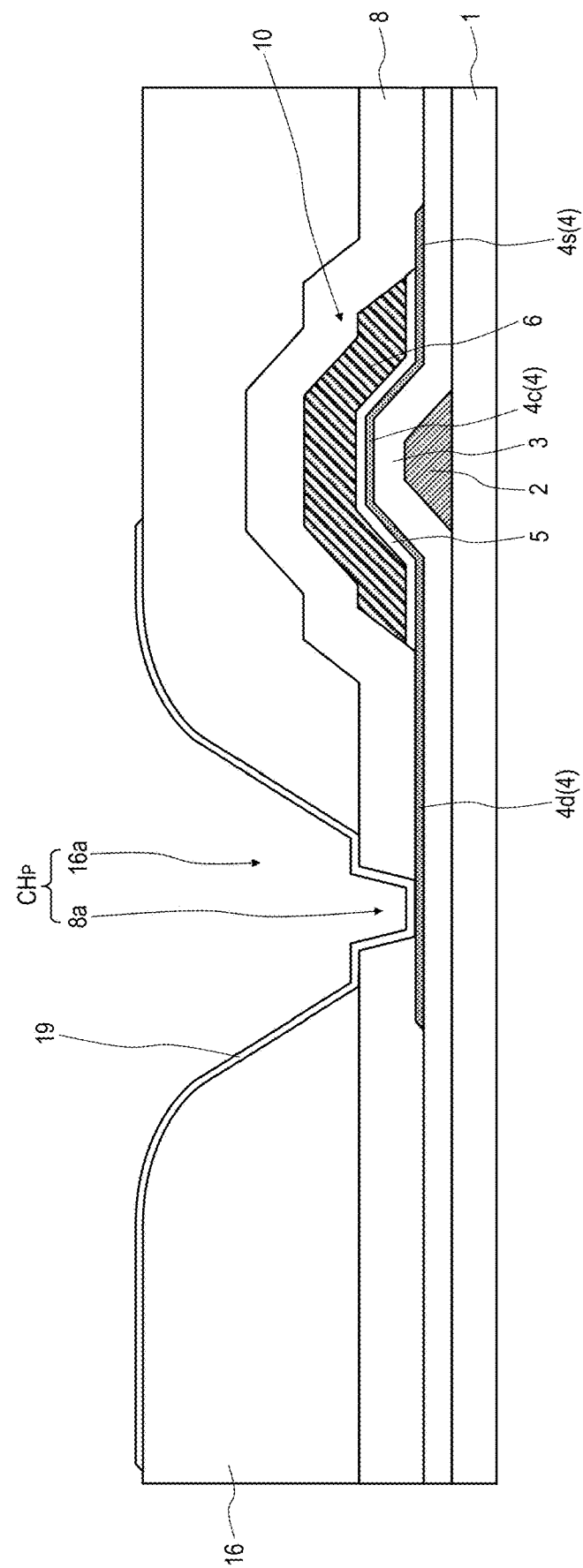
FIG. 24 is a cross-sectional view illustrating a step of the manufacture process of the active matrix substrate 100.

Then, as shown in FIG. 24, a connecting electrode 19 is formed in the pixel contact hole $CH_P$ and on the first flattening layer 16. For example, a transparent electrically-conductive film is deposited by sputtering and thereafter patterned through a photolithography process, whereby the connecting electrode 19 can be formed. As the transparent electrically-conductive material for formation of the connecting electrode 19, for example, an indium tin oxide (ITO) or an indium zinc oxide (IZO) can be used. Herein, an indium zinc oxide is used. The thickness of the connecting electrode 19 is, for example, equal to or greater than 30 nm and equal to or smaller than 100 nm.

Figure 25:
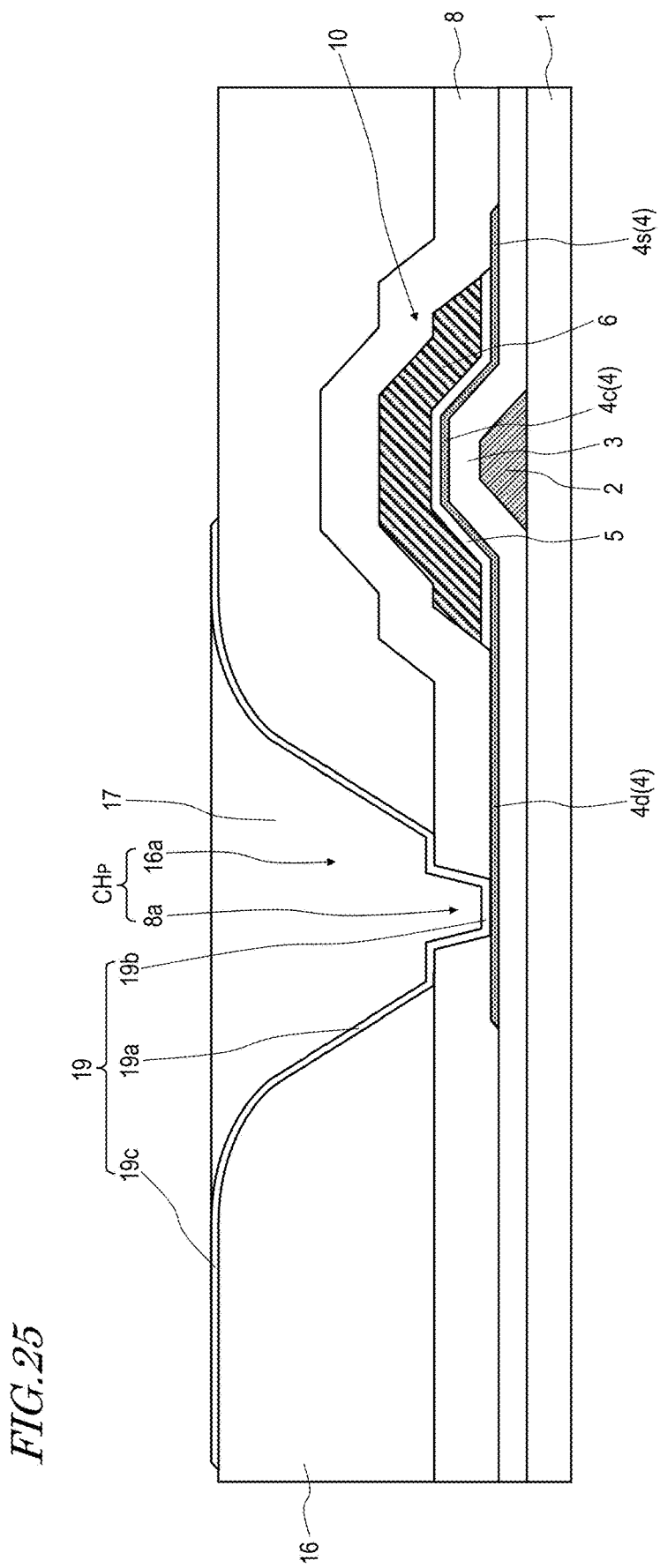
FIG. 25 is a cross-sectional view illustrating a step of the manufacture process of the active matrix substrate 100.

Subsequently, as shown in FIG. 25, a second flattening layer 17 is formed so as to fill the pixel contact hole $CH_P$. The second flattening layer 17 can be formed by, for example, application of a photosensitive resin material and exposure and development processes as is the first flattening layer 16. In the exposure process, using a gradation mask enables the second flattening layer 17 to precisely fill the pixel contact hole $CH_P$. As the gradation mask, specifically, a gray tone mask or a half tone mask can be used. The gray tone mask has slits that are equal to or lower than the resolution of the exposure machine, and the slits partially block light and hence realize intermediate exposures. In the half tone mask, a semi-transparent film is used for realizing intermediate exposure.

Figure 26:
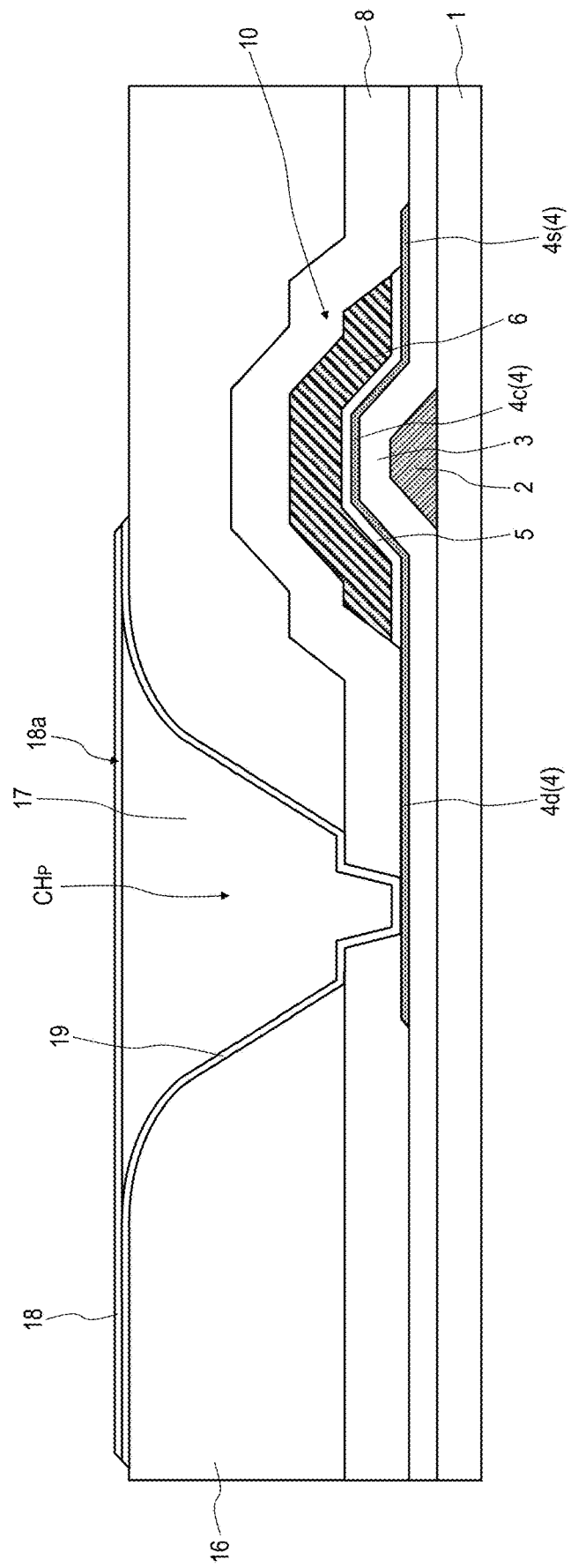
FIG. 26 is a cross-sectional view illustrating a step of the manufacture process of the active matrix substrate 100.

Then, as shown in FIG. 26, a pixel electrode 18 is formed on the first flattening layer 16 and the second flattening layer 17. For example, a transparent electrically-conductive film is deposited by sputtering and thereafter patterned through a photolithography process, whereby the pixel electrode 18 can be formed. As the transparent electrically-conductive material for formation of the pixel electrode 18, for example, an indium tin oxide or an indium zinc oxide can be used. Herein, an indium zinc oxide is used. The thickness of the pixel electrode 18 is, for example, equal to or greater than 30 nm and equal to or smaller than 100 nm.

Subsequently, a dielectric layer is formed so as to cover the pixel electrode 18. For example, the dielectric layer can be formed by CVD. As the dielectric layer, for example, an inorganic insulating layer similar to the interlayer insulating layer 8 can be used. Herein, as the dielectric layer, a silicon nitride layer is used. The thickness of the dielectric layer is, for example, equal to or greater than 50 nm and equal to or smaller than 300 nm.

Thereafter, a common electrode is formed on the dielectric layer. For example, a transparent electrically-conductive film is deposited by sputtering and thereafter patterned through a photolithography process, whereby the common electrode can be formed. As the transparent electrically-conductive material for formation of the common electrode, for example, an indium tin oxide or an indium zinc oxide can be used. Herein, an indium zinc oxide is used. The thickness of the common electrode is, for example, equal to or greater than 30 nm and equal to or smaller than 100 nm. Through the above-described process, the active matrix substrate 100 is manufactured.

Figure 27A:
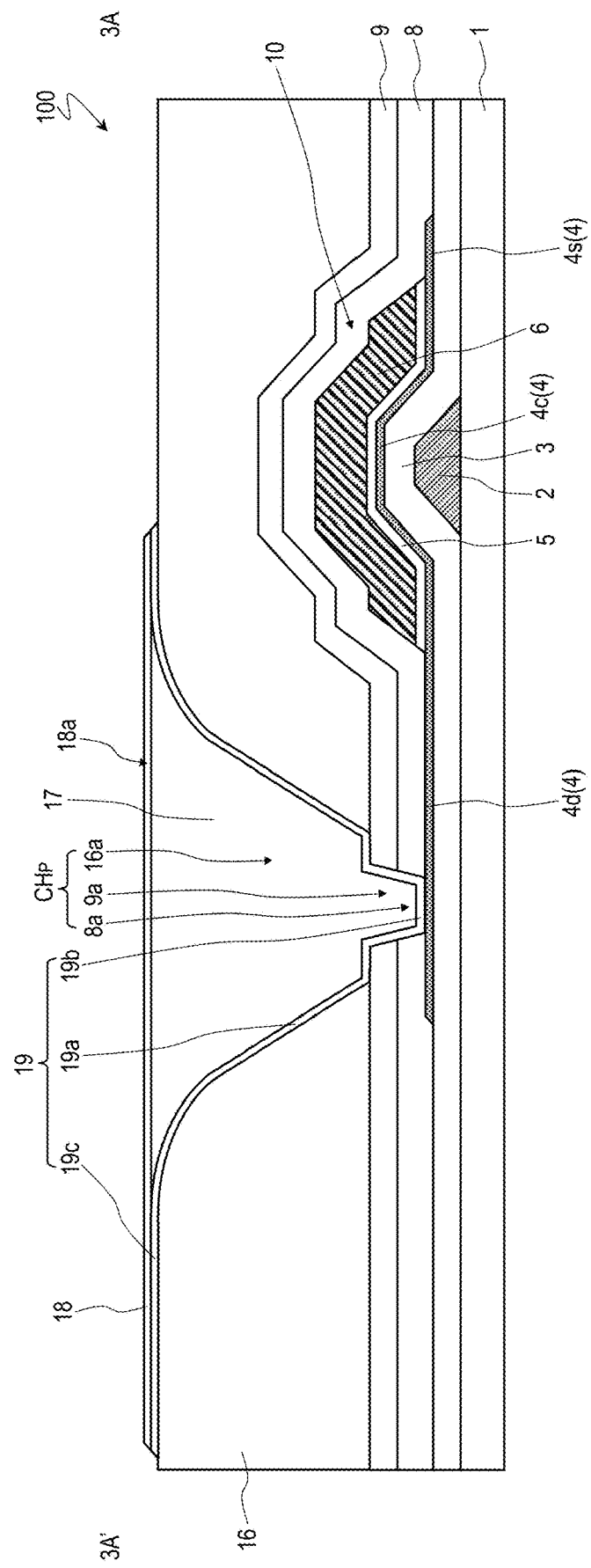
FIG. 27A is a cross-sectional view schematically showing the active matrix substrate 100, taken along line 3A-3A' of FIG. 2.
Figure 27B:
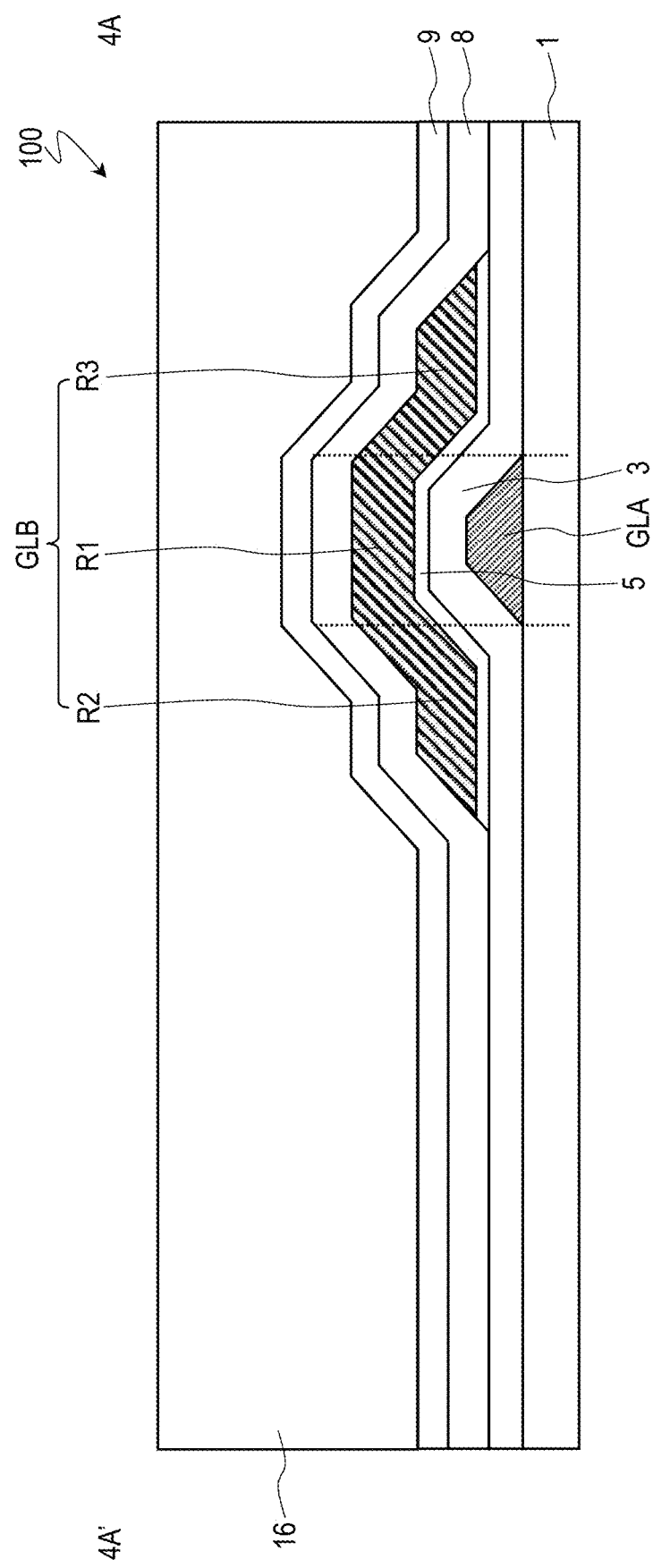
FIG. 27B is a cross-sectional view schematically showing the active matrix substrate 100, taken along line 4A-4A' of FIG. 2.
Figure 27C:
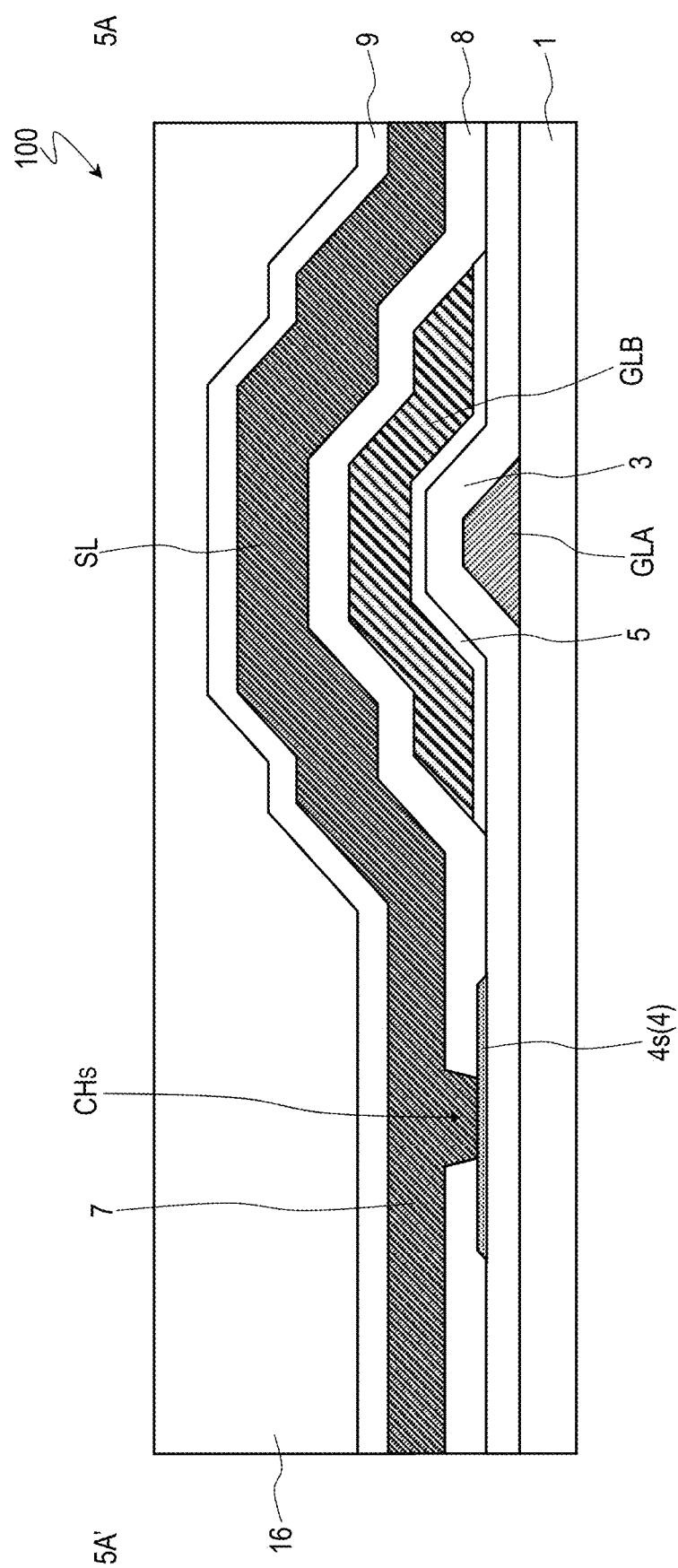
FIG. 27C is a cross-sectional view schematically showing the active matrix substrate 100, taken along line 5A-5A' of FIG. 2.

As shown in FIG. 27A, FIG. 27B and FIG. 27C, another interlayer insulating layer 9 may be provided between the source metal layer and the first flattening layer 16 so as to cover the source metal layer that includes the source electrode 7 and the source line SL. Hereinafter, the interlayer insulating layer 8 is sometimes referred to as "first interlayer insulating layer", and the interlayer insulating layer 9 is sometimes referred to as "second interlayer insulating layer". In this case, the pixel contact hole $CH_P$ consists of the opening 16a of the first flattening layer 16, the opening 8a of the first interlayer insulating layer 8, and an opening 9a formed in the second interlayer insulating layer 9. As the second interlayer insulating layer 9, specifically, various inorganic insulating layers illustrated as the first interlayer insulating layer 8 can be used.

Embodiment 2

Figure 28:
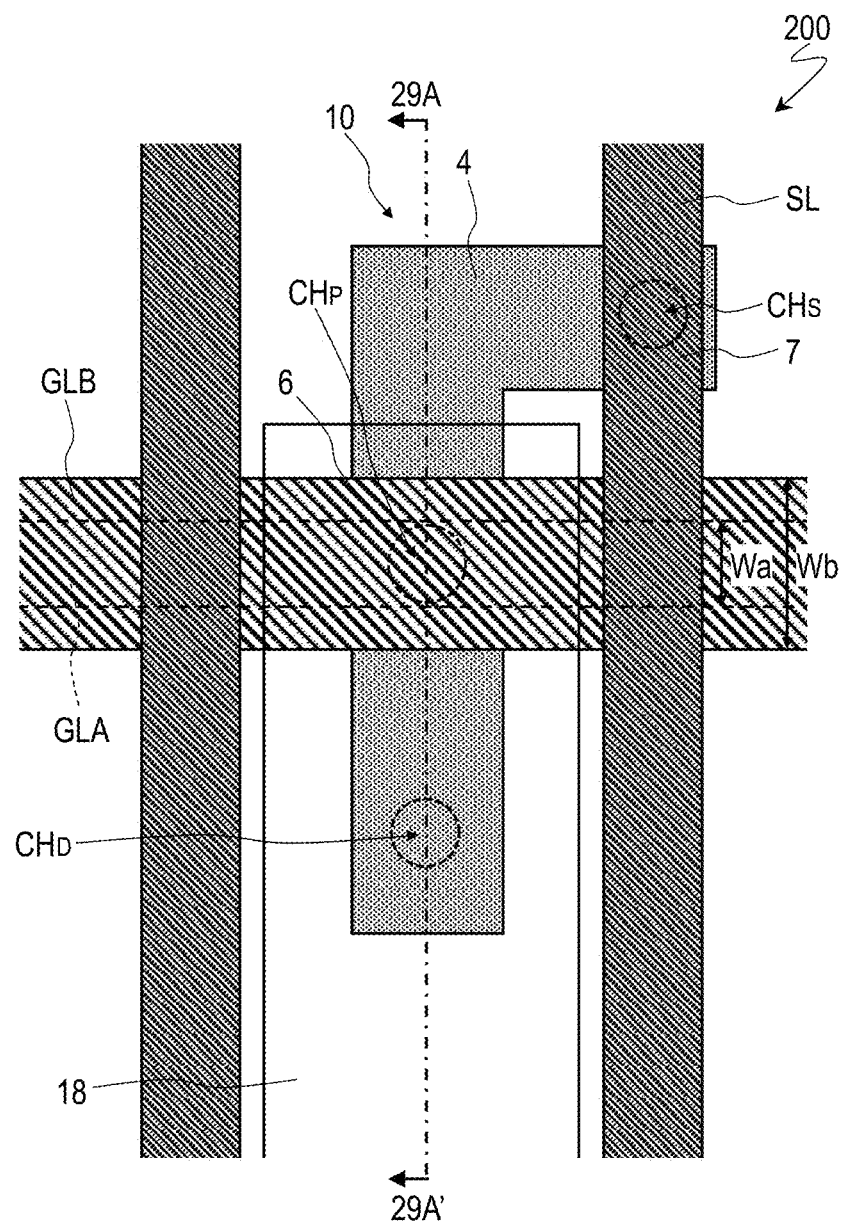
FIG. 28 is a plan view schematically showing another active matrix substrate 200 according to an embodiment of the present invention.
Figure 29:
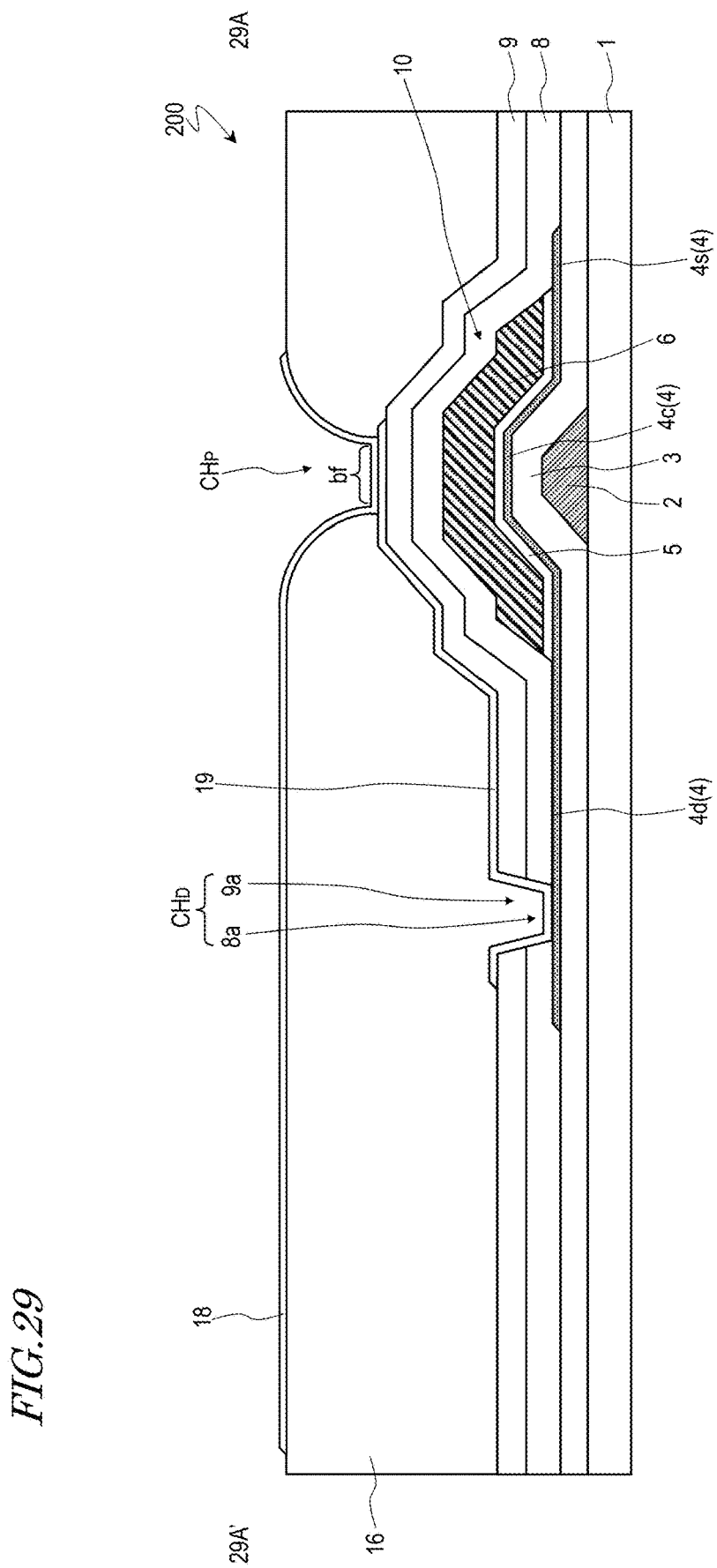
FIG. 29 is a cross-sectional view schematically showing the active matrix substrate 200, taken along line 29A-29A' of FIG. 28.

An active matrix substrate 200 of the present embodiment is described with reference to FIG. 28 and FIG. 29. FIG. 28 is a plan view schematically showing the active matrix substrate 200. FIG. 29 is a cross-sectional view schematically showing the active matrix substrate 200, taken along line 29A-29A' of FIG. 28. Hereinafter, the differences of the active matrix substrate 200 from the active matrix substrate 100 of Embodiment 1 are mainly described. The active matrix substrate 200 is different from the active matrix substrate 100 of Embodiment 1 in the arrangement of the pixel contact hole $CH_P$ as described below.

In the active matrix substrate 200, the connecting electrode 19 for electrically coupling the drain contact region 4d of the oxide semiconductor layer 4 with the pixel electrode 18 is provided on the second interlayer insulating layer 9. In the first interlayer insulating layer 8 and the second interlayer insulating layer 9, a drain contact hole $CH_D$ is formed such that the drain contact region 4d of the oxide semiconductor layer 4 is partially exposed. That is, the drain contact hole $CH_D$ consists of an opening 8a formed in the first interlayer insulating layer 8 and an opening 9a formed in the second interlayer insulating layer 9. A part of the connecting electrode 19 is in contact with the drain contact region 4d in the drain contact hole $CH_D$.

The first flattening layer 16 has a pixel contact hole $CH_P$ (opening 16a) that is formed such that the connecting electrode 19 is partially exposed. A part of the pixel electrode 18 is in contact with the connecting electrode 19 in the pixel contact hole $CH_P$. Note that the active matrix substrate 200 does not include a flattening layer for filling the pixel contact hole $CH_P$ (the second flattening layer 17 in Embodiment 1).

When viewed in the normal direction of the substrate 1, the bottom surface bf of the pixel contact hole $CH_P$ at least partially overlaps the lower gate metal layer and the upper gate metal layer. More specifically, the bottom surface bf of the pixel contact hole $CH_P$ at least partially overlaps the lower gate electrode 2 and the upper gate electrode 6. In the illustrated example, the entirety of the bottom surface bf of the pixel contact hole $CH_P$ overlaps the lower gate metal layer and the upper gate metal layer, more specifically, the lower gate electrode 2 and the upper gate electrode 6.

In the active matrix substrate 200 of the present embodiment, the width Wb of the upper gate line GLB is also greater than the width Wa of the lower gate line GLA and, therefore, occurrence of the source metal etching residue re can be suppressed.

In the active matrix substrate 200 of the present embodiment, the bottom surface bf of the pixel contact hole $CH_P$ formed in the first flattening layer 16 at least partially overlaps the lower gate electrode 2 and the upper gate electrode 6. As such, in exposing the photosensitive resin material to light, the thickness of the photosensitive resin material is reduced by the thickness of the lower gate electrode 2 and the thickness of the upper gate electrode 6 in a region where the pixel contact hole $CH_P$ is to be formed, while the exposure light is reflected by the upper gate electrode 6. Therefore, the pixel contact hole $CH_P$ can be formed with a shorter exposure duration and a smaller mask pattern. Thus, the opening diameter of the pixel contact hole $CH_P$ can be reduced. Since the opening diameter of the pixel contact hole $CH_P$ can be reduced, the lower gate electrode 2 and the upper gate electrode 6 can sufficiently block light even if a light shield layer is not formed, so that the aperture ratio can be improved.

So long as the bottom surface bf of the pixel contact hole $CH_P$ at least partially overlaps the lower gate electrode 2 and the upper gate electrode 6 when viewed in the normal direction of the substrate 1, the effects of reducing the opening diameter of the pixel contact hole $CH_P$ and improving the transmittance can be achieved. Note that, however, from the viewpoint of further improving the aperture ratio, it is more preferred that the entirety of the bottom surface bf of the pixel contact hole $CH_P$ overlaps the lower gate electrode 2 and the upper gate electrode 6.

Embodiment 3

Figure 30:
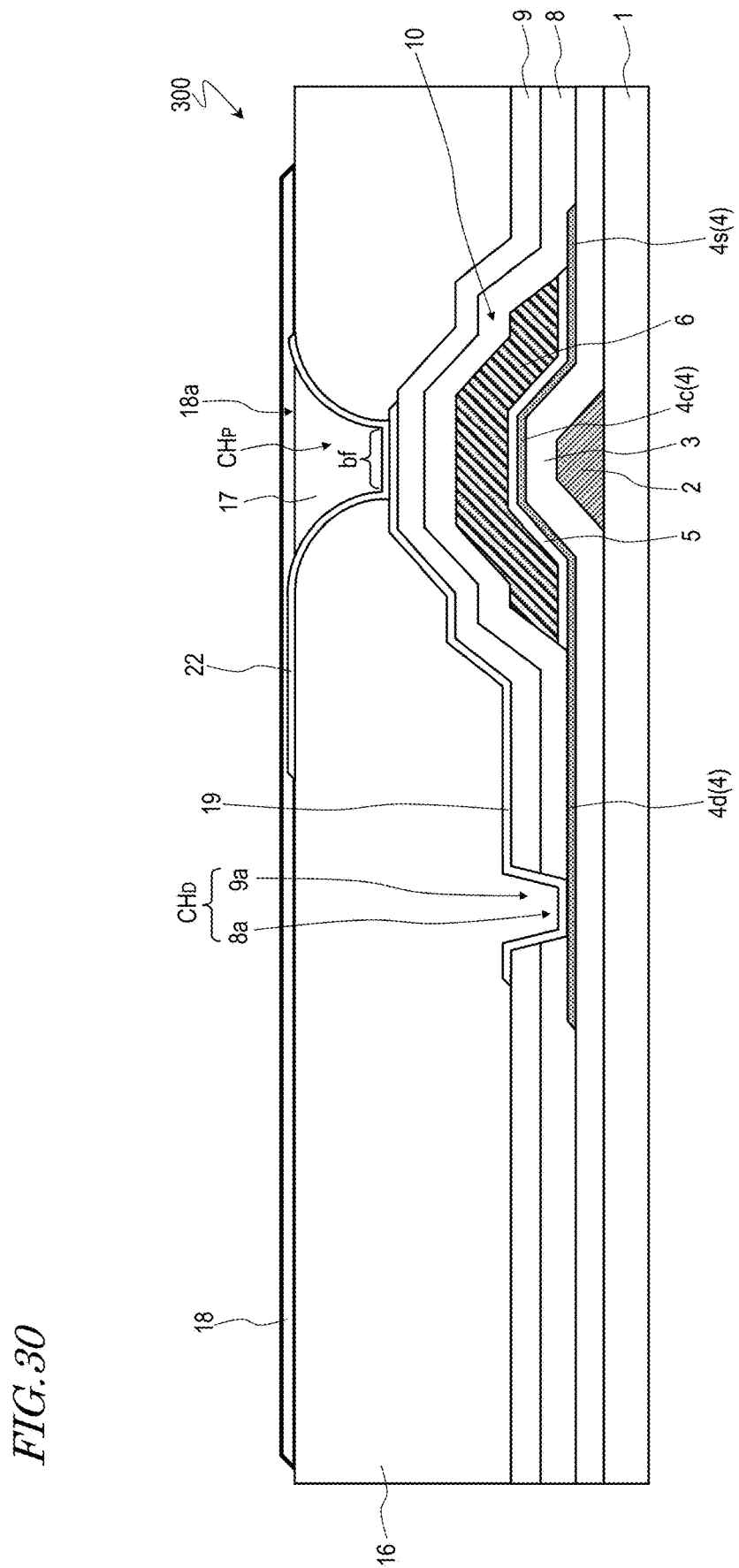
FIG. 30 is a cross-sectional view schematically showing still another active matrix substrate 300 according to an embodiment of the present invention.

An active matrix substrate 300 of the present embodiment is described with reference to FIG. 30. FIG. 30 is a cross-sectional view schematically showing the active matrix substrate 300.

The active matrix substrate 300 of the present embodiment is different from the active matrix substrate 200 of Embodiment 2 in that the active matrix substrate 300 includes a second flattening layer 17 and another connecting electrode 22 as shown in FIG. 30. Hereinafter, the connecting electrode 19 is referred to as "first connecting electrode", and the connecting electrode 22 is referred to as "second connecting electrode". The second connecting electrode 22 is made of a transparent electrically-conductive material and electrically couples together the first connecting electrode 19 and the pixel electrode 18. The second connecting electrode 22 is in contact with the first connecting electrode 19 in the pixel contact hole $CH_P$.

The second flattening layer 17 is provided so as to fill the pixel contact hole $CH_P$. The second flattening layer 17 partially covers the second connecting electrode 22.

The pixel electrode 18 is in contact with a part of the second connecting electrode 22 which is not covered with the second flattening layer 17. The pixel electrode 18 includes a portion 18a located on the second flattening layer 17.

In the active matrix substrate 300 of the present embodiment, the second flattening layer 17 is provided so as to fill the pixel contact hole $CH_P$, and the pixel electrode 18 includes the portion 18a located on the second flattening layer 17, so that alignment disorder of liquid crystal molecules which is attributed to the pixel contact hole $CH_P$ can be suppressed.

In the example shown in FIG. 30, the size of the second connecting electrode 22 is smaller than the size of the pixel electrode 18, although the size of the second connecting electrode 22 may be substantially equal to the size of the pixel electrode 18.

The second connecting electrode 22 can be formed by, for example, depositing a transparent electrically-conductive film by sputtering and thereafter patterning the transparent electrically-conductive film through a photolithography process. As the transparent electrically-conductive material for formation of the second connecting electrode 22, for example, an indium tin oxide or an indium zinc oxide can be used. The thickness of the second connecting electrode 22 is, for example, equal to or greater than 30 nm and equal to or smaller than 100 nm.

Embodiment 4

Figure 31:
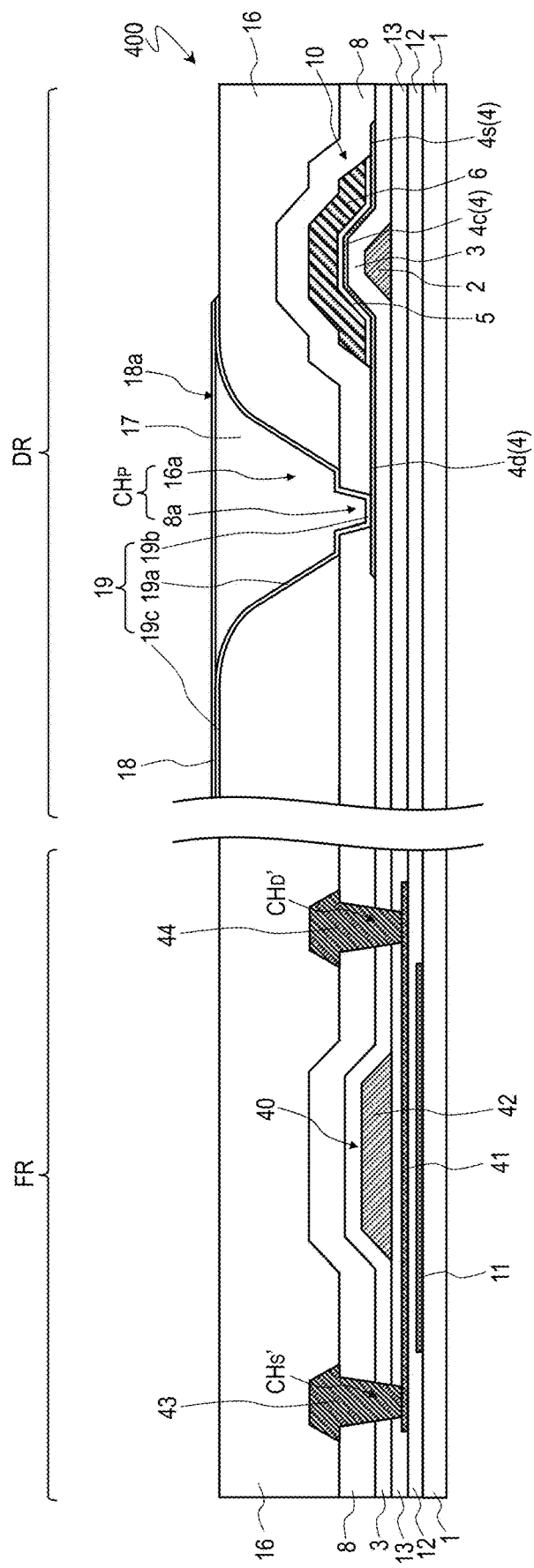
FIG. 31 is a cross-sectional view schematically showing still another active matrix substrate 400 according to an embodiment of the present invention.

An active matrix substrate 400 of the present embodiment is described with reference to FIG. 31. FIG. 31 is a cross-sectional view schematically showing the active matrix substrate 400. The right part of FIG. 31 shows a part of the display region DR, and the left part of FIG. 31 shows a part of the non-display region FR.

The active matrix substrate 400 includes a first TFT 10 and a second TFT 40 supported by the substrate 1 as shown in FIG. 31. The first TFT 10 is a pixel TFT provided in each of the pixel regions P of the display region DR and is an oxide semiconductor TFT that includes an oxide semiconductor layer 4 as the active layer. The configuration of the display region DR of the active matrix substrate 400 is substantially the same as that of the display region DR of the active matrix substrate 100 of Embodiment 1 (or the active matrix substrate 200 of Embodiment 2 or the active matrix substrate 300 of Embodiment 3).

The second TFT 40 is provided in the non-display region. The second TFT 40 is a crystalline silicon TFT that includes a crystalline silicon semiconductor layer 41 as the active layer. The second TFT 40 is a circuit TFT that is a constituent of peripheral circuits. For example, the second TFT 40 is a constituent of a GDM (Gate Driver Monolithic) circuit or a SSD (Source Shared Driving) circuit. The second TFT 40 includes a gate electrode 42, a source electrode 43 and a drain electrode 44 in addition to the above-described crystalline silicon semiconductor layer 41.

In the present embodiment, the crystalline silicon semiconductor layer 41 is a polycrystalline silicon layer (e.g., low-temperature polysilicon (LTPS) layer). In the illustrated example, a base coat layer (underlayer) 12 is provided on the substrate 1, and the crystalline silicon semiconductor layer 41 is provided on the base coat layer 12.

The gate electrode 42 is provided on an insulating layer 13 that covers the crystalline silicon semiconductor layer 41, and opposes the crystalline silicon semiconductor layer 41 with the insulating layer 13 interposed therebetween. The gate electrode 42 is formed in the same layer as the lower gate electrode 2 of the first TFT 10 (i.e., by patterning an identical electrically-conductive film). The insulating layer 13 is made of an inorganic insulating material similar to the material of the lower gate insulating layer 3.

The source electrode 43 and the drain electrode 44 are formed in the same layer as the source electrode 7 of the first TFT 10 (i.e., by patterning an identical electrically-conductive film). Therefore, the source electrode 43 and the drain electrode 44 are provided on the first interlayer insulating layer 8. The source electrode 43 and the drain electrode 44 are connected with the crystalline silicon semiconductor layer 41 in the source contact hole $CH_S'$ and the drain contact hole $CH_D'$ that are formed in the first interlayer insulating layer 8, the lower gate insulating layer 3 and the insulating layer 13.

As previously described, the second TFT 40 has a top gate structure. The channel region of the crystalline silicon semiconductor layer 41 of the second TFT 40 (a region opposing the gate electrode 42) is shielded from light by a light shield layer 11 formed under the base coat layer 12.

In the present embodiment, an oxide semiconductor TFT that is excellent in the off-leak characteristics is used as the pixel TFT 10 while a crystalline silicon TFT that is excellent in mobility is used as the circuit TFT 40 and, therefore, reduction in power consumption is achieved while the driving performance can be improved. As previously described, the gate electrode 42 of the circuit TFT 40 is formed in the same layer as the lower gate electrode 2 of the pixel TFT 10 and, therefore, increase in the manufacture steps can be suppressed.

Regarding Oxide Semiconductor

The oxide semiconductor included in the oxide semiconductor layer 4 may be an amorphous oxide semiconductor or may be a crystalline oxide semiconductor which includes a crystalline portion. Examples of the crystalline oxide semiconductor include a polycrystalline oxide semiconductor, a microcrystalline oxide semiconductor, and a crystalline oxide semiconductor in which the c-axis is oriented generally perpendicular to the layer surface.

The oxide semiconductor layer 4 may have a multilayer structure consisting of two or more layers. The oxide semiconductor layer 4 that has a multilayer structure may include an amorphous oxide semiconductor layer and a crystalline oxide semiconductor layer or may include a plurality of crystalline oxide semiconductor layers having different crystalline structures. The oxide semiconductor layer 4 that has a multilayer structure may include a plurality of amorphous oxide semiconductor layers. When the oxide semiconductor layer 4 has a multilayer structure, the respective layers have different energy gaps.

The materials, structures and film formation methods of the amorphous oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399. The entire disclosure of Japanese Laid-Open Patent Publication No. 2014-007399 is incorporated by reference in this specification.

The oxide semiconductor layer 4 may include, for example, at least one metal element among In, Ga and Zn. In the above-described embodiment, the oxide semiconductor layer 4 includes, for example, an In—Ga—Zn—O based semiconductor (e.g., indium gallium zinc oxide). Here, the In—Ga—Zn—O based semiconductor is a ternary oxide including In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer 4 which has such a composition can be formed by an oxide semiconductor film which includes an In—Ga—Zn—O based semiconductor.

The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred.

The crystalline structure of the crystalline In—Ga—Zn—O based semiconductor is disclosed in, for example, aforementioned Japanese Laid-Open Patent Publication No. 2014-007399, Japanese Laid-Open Patent Publication No. 2012-134475, and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT (e.g., a TFT included in a driving circuit provided around the display region including a plurality of pixels on the same substrate as the display region) and a pixel TFT (a TFT provided in a pixel).

The oxide semiconductor layer 4 may contain a different oxide semiconductor instead of the In—Ga—Zn—O based semiconductor. For example, the oxide semiconductor layer 4 may contain an In—Sn—Zn—O based semiconductor (e.g., $In_2O_3$-$SnO_2$—ZnO; InSnZnO). In—Sn—Zn—O based semiconductor is a ternary oxide including In (indium), Sn (tin) and Zn (zinc). Alternatively, the oxide semiconductor layer 4 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, or the like.

Liquid Crystal Display Device

The active matrix substrates 100, 200, 300 and 400 according to embodiments of the present invention can be suitably used in liquid crystal display devices. An example of the liquid crystal display devices is shown in FIG. 32.

Figure 32:
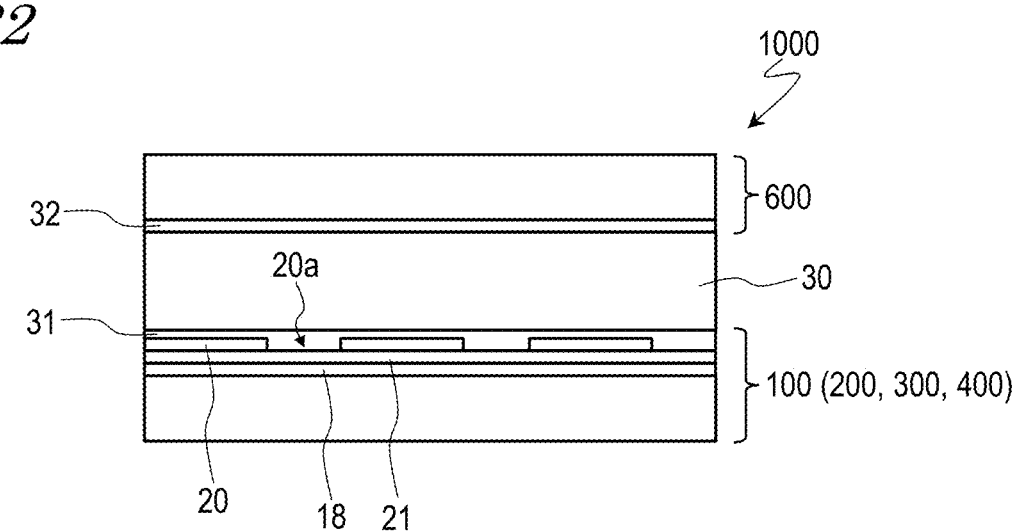
FIG. 32 is a cross-sectional view schematically showing a liquid crystal display device 1000 that includes the active matrix substrate 100 (200, 300, 400) according to an embodiment of the present invention.

A liquid crystal display device 1000 shown in FIG. 32 includes the active matrix substrate 100 (or the active matrix substrate 200, 300, 400), a counter substrate 600 provided so as to oppose the active matrix substrate 100, and a liquid crystal layer 30 provided between the active matrix substrate 100 and the counter substrate 600.

The active matrix substrate 100 includes TFTs 10 (herein, not shown) provided in respective ones of the pixel regions P, pixel electrodes 18 electrically coupled with the TFTs 10, a dielectric layer 21 provided so as to cover the pixel electrode 18, and a common electrode 20 provided on the dielectric layer 21 and opposing the pixel electrode 18. The common electrode 20 has at least one slit 20a for each of the pixel regions P.

The outermost surfaces on the liquid crystal layer 30 side of the active matrix substrate 100 and the counter substrate 600 are provided with alignment films 31 and 32, respectively. Typically, the counter substrate 600 includes a color filter layer and a black matrix (both not shown).

The thickness of the liquid crystal layer 30 (cell gap) is defined by pillar spacers (not shown) provided on the liquid crystal layer 30 side of the counter substrate 600.

In the example described herein, the liquid crystal display device 1000 is an FFS mode liquid crystal display device that is one type of the transverse electric field mode liquid crystal display devices, although the active matrix substrate according to an embodiment of the present invention may be used in liquid crystal display devices of other display modes. In a liquid crystal display device of a vertical electric field mode such as TN (Twisted Nematic) mode or VA (Vertical Alignment) mode, the common electrode is provided on the counter substrate side.

According to an embodiment of the present invention, in an active matrix substrate including double-gate structure oxide semiconductor TFTs, occurrence of source metal etching residues can be suppressed. An active matrix substrate according to an embodiment of the present invention can be suitably used in high resolution (e.g., 1000 ppi or higher) liquid crystal display devices, such as liquid crystal display devices for head-mounted displays.

This application is based on U.S. Provisional Application No. 63/404,978 filed on Sep. 9, 2022, the entire contents of which are hereby incorporated by reference.

What is claimed is:

1. An active matrix substrate having a display region defined by a plurality of pixel regions arrayed in a matrix, the active matrix substrate comprising:
    a substrate;
    a pixel thin film transistor (TFT) supported by the substrate and located in a corresponding one of the plurality of pixel regions; and
    a pixel electrode electrically coupled with the pixel TFT, wherein the pixel TFT includes
        a lower gate electrode provided on the substrate,
        a lower gate insulating layer located so as to cover the lower gate electrode,
        an oxide semiconductor layer provided on the lower gate insulating layer, the oxide semiconductor layer including a channel region opposing the lower gate electrode with the lower gate insulating layer interposed therebetween and a source contact region and a drain contact region located at opposite sides of the channel region,
        an upper gate insulating layer provided on the channel region of the oxide semiconductor layer, and
        an upper gate electrode provided on the upper gate insulating layer and opposing the channel region of the oxide semiconductor layer with the upper gate insulating layer interposed therebetween,
    wherein the active matrix substrate includes
        a lower gate metal layer that includes the lower gate electrode and a lower gate line electrically coupled with the lower gate electrode of the pixel TFT, and
        an upper gate metal layer that includes the upper gate electrode and an upper gate line electrically coupled with the upper gate electrode of the pixel TFT, and
    wherein a width of the upper gate line electrically coupled with the upper gate electrode of the pixel TFT is greater than a width of the lower gate line electrically coupled with the lower gate electrode of the pixel TFT.

2. The active matrix substrate of claim 1, wherein the lower gate electrode and the upper gate electrode are electrically coupled with each other and supplied with an equal potential.

3. The active matrix substrate of claim 1, wherein the width of the upper gate line is greater than the width of the lower gate line by 1.0 µm or more.

4. The active matrix substrate of claim 1, further comprising a first flattening layer located so as to cover the thin film transistor, wherein the pixel electrode is provided on the first flattening layer.

5. The active matrix substrate of claim 4, further comprising a connecting electrode electrically coupling the drain contact region of the oxide semiconductor layer with the pixel electrode, the connecting electrode being made of a transparent electrically-conductive material.

6. The active matrix substrate of claim 5, wherein
    the first flattening layer has a first opening in which a portion of the connecting electrode is located, and
    the active matrix substrate further includes a second flattening layer provided so as to fill the first opening of the first flattening layer, the second flattening layer being located so as to cover the portion of the connecting electrode.

7. The active matrix substrate of claim 6, wherein
    the pixel electrode is in contact with a part of the connecting electrode which is not covered with the second flattening layer, and
    the pixel electrode includes a portion located on the second flattening layer.

8. The active matrix substrate of claim 1, wherein the oxide semiconductor layer includes an In—Ga—Zn—O based semiconductor.

9. A liquid crystal display device comprising:
    the active matrix substrate as set forth in claim 1;
    a counter substrate provided so as to oppose the active matrix substrate;

a liquid crystal layer provided between the active matrix substrate and the counter substrate.

10. The active matrix substrate of claim 1, further comprising:
- an interlayer insulating layer provided so as to cover the upper gate electrode and the oxide semiconductor layer, the interlayer insulating layer including a second opening,
- a source electrode provided on the interlayer insulating layer, the source electrode being electrically coupled with the source contact region of the oxide semiconductor layer via the second opening, and
- a source metal layer that includes the source electrode and a source line electrically coupled with the source electrode,
- wherein the lower gate line extends so as to overlap the upper gate line in a plan view.

11. The active matrix substrate of claim 10, wherein the source line intersects the upper gate line and the lower gate line.

* * * * *